United States Patent
Takei et al.

(10) Patent No.: US 9,946,158 B2
(45) Date of Patent: Apr. 17, 2018

(54) COMPOSITION FOR FORMING RESIST UNDERLAYER FILM FOR NANOIMPRINT

(71) Applicant: NISSAN CHEMICAL INDUSTRIES, LTD., Tokyo (JP)

(72) Inventors: Satoshi Takei, Funabashi (JP); Tomoya Ohashi, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/570,627

(22) Filed: Dec. 15, 2014

(65) Prior Publication Data

US 2015/0099070 A1 Apr. 9, 2015

Related U.S. Application Data

(62) Division of application No. 13/386,230, filed as application No. PCT/JP2010/062545 on Jul. 26, 2010, now abandoned.

(30) Foreign Application Priority Data

Jul. 29, 2009 (JP) ................. 2009-176165

(51) Int. Cl.
| | |
|---|---|
| *B05D 7/14* | (2006.01) |
| *G03F 7/075* | (2006.01) |
| *B82Y 10/00* | (2011.01) |
| *B82Y 40/00* | (2011.01) |
| *C08G 77/04* | (2006.01) |
| *C08G 77/14* | (2006.01) |
| *C09D 183/06* | (2006.01) |
| *G03F 7/00* | (2006.01) |
| *G03F 7/11* | (2006.01) |
| *G03F 7/20* | (2006.01) |

(52) U.S. Cl.
CPC ............ *G03F 7/0757* (2013.01); *B82Y 10/00* (2013.01); *B82Y 40/00* (2013.01); *C08G 77/045* (2013.01); *C08G 77/14* (2013.01); *C09D 183/06* (2013.01); *G03F 7/0002* (2013.01); *G03F 7/0752* (2013.01); *G03F 7/11* (2013.01); *G03F 7/2051* (2013.01)

(58) Field of Classification Search
CPC ...... B82Y 10/00; B82Y 40/00; C08G 77/045; C08G 77/14; C09D 4/00; C09D 183/06; G03F 7/0002; G03F 7/0752; G03F 7/0757; G03F 7/2051; G03F 7/11
See application file for complete search history.

(56) References Cited

U.S. PATENT DOCUMENTS

| | | | |
|---|---|---|---|
| 5,804,631 A * | 9/1998 | Mine ................. | C08K 3/08 257/783 |
| 7,027,156 B2 | 4/2006 | Watts et al. | |
| 2008/0097065 A1 | 4/2008 | Xu et al. | |
| 2009/0162782 A1 | 6/2009 | Takei et al. | |
| 2009/0202788 A1 | 8/2009 | Fu et al. | |
| 2009/0263631 A1 | 10/2009 | Sakamoto et al. | |

FOREIGN PATENT DOCUMENTS

| | | |
|---|---|---|
| JP | A-2004-303870 | 10/2004 |
| JP | A-2005-159358 | 6/2005 |
| JP | A-2005-532576 | 10/2005 |
| JP | A-2006-114882 | 4/2006 |
| JP | A-2006-516065 | 6/2006 |
| JP | A-2006-287012 | 10/2006 |
| JP | A-2007-30212 | 2/2007 |
| JP | A-2007-072374 | 3/2007 |
| JP | A-2007-223206 | 9/2007 |
| JP | A-2007-305647 | 11/2007 |
| JP | A-2008-105414 | 5/2008 |
| JP | A-2009-501091 | 1/2009 |
| JP | A-2009-051017 | 3/2009 |
| JP | A-2009-73809 | 4/2009 |
| WO | WO 2007/066597 A1 | 6/2007 |
| WO | WO 2008/149544 A1 | 12/2008 |
| WO | WO 2009/068755 A1 | 6/2009 |

OTHER PUBLICATIONS

McMackin et al., "High Resolution Defect Inspection of Step and Flash Imprint Lithography for 32 nm Half-Pitch Patterning," *Proceedings of SPIE: Emerging Lithographic Technologies XII*, 2008, pp. 69211L-1 through 69211L-12, vol. 6921, part 1 of 2, San Jose, California, USA.

Hao et al., "Photocurable Silicon-Based Materials for Imprint Lithography," *Proceedings of SPIE: Emerging Lithographic Technologies XI*, 2007, pp. 651729-1 through 651729-9, vol. 6517, part 2 of 2, San Jose, California, USA.

Nakamatsu et al., "Nanoimprint and Lift-Off Process Using Poly (vinyl alcohol)," *Japanese Journal of Applied Physics*, 2005, pp. 8186-8188, vol. 44, No. 11, The Japan Society of Applied Physics, Japan.

Oct. 26, 2010 Written Opinion issued in PCT/JP2010/062545.

Oct. 26, 2010 International Search Report issued in PCT/JP2010/062545.

Brewer Science et al., "DUV Anti-Reflective Coatings", 2002, URL:http://people.rit.edu/deeemc/courses/0305-676/references/arcs/DUV ARC Overview.pdf.

Stewart et al., "Nanofabrication with step and flash imprint lithography" *Journal of Microlith., Microfab., and Microsyst.*, 2005, vol. 4, No. 1, pp. 011002-1 through 011002-6.

(Continued)

*Primary Examiner* — Robert S Walters, Jr.
(74) *Attorney, Agent, or Firm* — Oliff PLC

(57) ABSTRACT

Disclosed herein is a composition for forming a resist underlayer film used as an underlayer of a resist for nanoimprint in nanoimprint lithography of a pattern forming process by heat-baking, light-irradiation, or a combination thereof to form the resist underlayer film. The composition includes a silicon atom-containing polymerizable compound (A), a polymerization initiator (B), and a solvent (C). The polymerizable compound (A) may contain silicon atoms in a content of 5 to 45% by mass. The polymerizable compound (A) may be a polymerizable compound having at least one cation polymerizable reactive group, a polymerizable compound having at least one radical polymerizable reactive group, or a combination thereof, and the polymerization initiator (B) may be a photopolymerization initiator.

11 Claims, No Drawings

(56) References Cited

OTHER PUBLICATIONS

Takei et al., "Silicon-Containing Spin-on Underlayer Material for Step and Flash Nanoimprint Lithography", *Japanese Journal of Applied Physics*, 2010, vol. 49, No. 7, pp. 075201-1 through 075201-5.
May 21, 2013 Extended European Search Report issued in European Patent Application No. 10 804 376.1.

* cited by examiner

COMPOSITION FOR FORMING RESIST UNDERLAYER FILM FOR NANOIMPRINT

RELATED APPLICATIONS

This is a Division of application Ser. No. 13/386,230 filed Jan. 20, 2012, now abandoned, which in turn is a National Stage Application of PCT/JP2010/062545 filed Jul. 26, 2010, which claims the benefit of Japanese Patent Application No. 2009-176165 filed Jul. 29, 2009. The disclosure of the prior applications is hereby incorporated by reference herein in its entirety.

TECHNICAL FIELD

The present invention relates to a composition for forming an underlayer film between a substrate to be processed and a resist for nanoimprint. More in detail, the present invention relates to an underlayer film forming composition for forming an underlayer film used as an underlayer of a resist for nanoimprint in a pattern forming process by performing heat-baking, light-irradiation, or both of them. The present invention relates also to a forming method of an underlayer film using the underlayer film forming composition and a forming method of a resist pattern for nanoimprint.

BACKGROUND ART

Conventionally in the production of semiconductor devices, fine processing by photolithography using a photoresist has been performed. The fine processing is a processing method for forming fine convexo-concave shapes corresponding to the following pattern on the surface of a substrate by: forming a thin film of a photoresist on a semiconductor substrate such as a silicon wafer; irradiating the resultant thin film with an active ray such as an ultraviolet ray through a mask pattern in which a pattern of a semiconductor device is depicted for development; and subjecting the substrate to etching processing using the resultant photoresist pattern as a protecting film. There is disclosed a method for forming a cured film by irradiating an underlayer film of the photoresist with light (Patent Document 1).

As a pattern forming method of the next generation, nanoimprint lithography has attracted attention as one technology. The nanoimprint lithography is a method entirely different from conventional lithography using a light source. The nanoimprint lithography is a method for producing a pattern symmetric to a pattern of a template on a substrate by preparing a mold (template) having a pattern symmetric to a pattern produced beforehand and by directly pushing the mold into a resist applied on the substrate. The nanoimprint lithography is characterized in that the resolution of the nanoimprint lithography does not depend on the light source wavelength in comparison with conventional photolithography, so that an expensive apparatus such as an excimer laser exposing apparatus and an electron beam drawing apparatus is not necessary, and consequently, the cost therefor can be reduced (see, for example, Patent Document 2 and Patent Document 3).

That is, the nanoimprint lithography is a pattern forming method by: dropping by inkjet a composition of a resist for nanoimprint onto an inorganic substrate such as silicon and gallium, an oxide film, a nitride film, a quartz, a glass, or a polymer film to apply the composition thereon in a film thickness of about some ten nanometers to some micrometers; pressing a template having a fine convexo-concave shape of about some ten nanometers to some ten micrometers pattern size against the composition to pressurize the composition; irradiating the composition with light or heat-baking the composition while the composition is in a pressurized state to cure the composition; and releasing the template from the coating film to obtain a transferred pattern. Therefore, in the case of the nanoimprint lithography, for the convenience of performing light-irradiation, it is necessary that at least any one of the substrate and the template is transparent. Ordinarily, it is general to perform light-irradiation from the template side, so that, as the material for the template, there is used an optically transparent inorganic material such as quartz and sapphire or a light transmittable resin.

In order to apply the nanoimprint lithography to the imprint of a nanometer-sized pattern in a large area, there are required not only homogeneity of a pressure for pressing the template against the composition and planarity of the template or the surface of a base, but also the control of the behavior of a resist for nanoimprint that is pressed-against and flows out. In conventional semiconductor lithography, a region that is not used as an element can optionally be set on a substrate to be processed, so that a resist flow-out part can be provided using a small template in the outside of an imprint part. In the case of a semiconductor, it is satisfactory that an imprint defective part is regarded as a defective element and not used. However, for example, in the case of applying to a hard disc, the entirety functions as a device, so that a special devisal for not causing an imprint defect is necessary.

The nanoimprint lithography is a technology for patterning by a physical contact, so that as the miniaturization is progressed, there is easily caused a problem of a patterning loss such as chipping and peeling of a pattern and foreign matters caused by reattachment of the chipped or peeled pattern (see, for example, Non-patent Document 1). Peeling properties between the template and the resist for nanoimprint and adhesion between the resist for nanoimprint and the base substrate to be processed are important, so that conventionally, there has been attempted to solve a problem of defect or foreign matters by surface modifying treatment of the template or the resist.

The resist composition for nanoimprint is classified roughly into a radical crosslinking type, a cation crosslinking type, and a mixed type thereof according to the photo-reaction mechanisms (see, for example, Patent Document 4, Patent Document 5, and Patent Document 6). The radical crosslinking type contains a compound derivative having an ethylenic unsaturated bond and uses generally a composition containing a polymerizable compound having a radical polymerizable methacrylate, acrylate, or vinyl group and a photocrosslinking initiator. On the other hand, the cation crosslinking type uses generally a composition containing a polymerizable compound that is a compound derivative having an epoxy or oxetane ring and a photocrosslinking initiator. When such a composition is irradiated with light, a radical or a cation that is generated from the photocrosslinking initiator attacks the ethylenic unsaturated bond or the epoxy or oxetane ring respectively, and a chain polymerization and a crosslinking reaction are progressed to form a three-dimensional network structure. When a monomer or oligomer having a multifunctional group such as a bifunctional or more group is used as a component, a crosslinked structure can be obtained.

In addition, various resists are disclosed (see Non-patent Document 2, Non-patent Document 3, and Patent Document 7).

Although the imprint lithography has previously existed, in recent years, the imprint lithography has been studied also for the formation of a fine nanopattern such as a nanopattern having some ten nanometers. However, with respect to the nanoimprint lithography, there is feared a defect caused by a direct physical contact of a resist for nanoimprint with a template (see, for example, Patent Document 8). Further, when a superposition or a large area is transferred in a lump, there is caused a problem of peeling of a resist for nanoimprint due to an adhesion failure between a substrate to be processed and a resist for nanoimprint or a problem of a variation of the film thickness of a resist for nanoimprint due to an in-plane homogeneity.

Further, in recent years, there has been caused a problem of lack of smoothness or planarity at a nano level that has become apparent according to the miniaturization of a thin line width of a pattern (see, for example, Patent Document 9). That is, following the miniaturization, a step or a via hole is formed on a substrate to be processed and a resist for nanoimprint is formed on a substrate to be processed having a large aspect ratio. Therefore, for the resist for nanoimprint used in this process, besides a characteristic of pattern forming, a characteristic of capable of controlling coating properties of a substrate around a step or a via hole, an embedding characteristic capable of filling a via hole without void, a planarizing characteristic capable of forming a planar film on the surface of a substrate, and the like are required. However, it is difficult to apply a resist for nanoimprint to a substrate having a large aspect ratio.

With respect to an attempt to add an underlayer film between a substrate to be processed and a resist for nanoimprint for solving these problems, there is conventionally no disclosure of a resist underlayer film for nanoimprint for being suitably used or no guideline for designing a material for the underlayer film. In a process for the purpose of imparting adhesion or planarity to a resist underlayer film for imprint known as an application for conventional macroimprint lithography, although some materials therefor are common with those for a resist underlayer film for nanoimprint, the above planarity is largely different from planarity characteristic on a fine pattern shape having a nanometer width or on a step or via hole having a nanometer width. Therefore, when an underlayer film applied to nanoimprint lithography is applied to nanoimprint lithography, there are frequently caused such problems as peeling of a resist for nanoimprint due to a failure of adhesion between a substrate to be processed and a resist for nanoimprint, an etching failure due to a variation of the film thickness of a resist for nanoimprint due to in-plane homogeneity, and peeling of a resist for nanoimprint due to a failure of surface smoothness or planarity.

RELATED-ART DOCUMENT

Patent Document

Patent Document 1: International Publication No. WO 2007/066597 pamphlet
Patent Document 2: Japanese Patent Application Publication No. 2006-287012
Patent Document 3: Japanese Patent Application Publication No. 2007-305647
Patent Document 4: Japanese Patent Application Publication No. 2007-072374
Patent Document 5: Japanese Patent Application Publication No. 2008-105414
Patent Document 6: Japanese Patent Application Publication No. 2009-51017
Patent Document 7: Japanese Patent Application Publication No. 2006-114882
Patent Document 8: Japanese Patent Application Publication No. 2005-159358
Patent Document 9: Japanese Patent Application Publication No. 2005-532576

Non-Patent Document

Non-patent Document 1: I. McMackin, et. al., Proc. of SPIE 6921, 69211L (2008)
Non-patent Document 2: Jianjun Hao et. al., Proc. of SPIE 6517, 651729 (2007)
Non-patent Document 3: Ken-ichiro Nakamatsu et. al., Japanese Journal of Applied Physics 44, 8186 (2005)

DISCLOSURE OF THE INVENTION

Problem to be Solved by the Invention

The present invention has been invented in the light of the present situation described above. That is, it is an object of the present invention to provide a silicon atom-containing resist underlayer film forming composition for curing a resist underlayer film used as an underlayer of a resist for nanoimprint in nanoimprint lithography of a pattern forming process by light-irradiation or heat-baking to form the resist underlayer film. It is also an object of the present invention to provide a forming method of an underlayer film used as an underlayer of a resist for nanoimprint in nanoimprint lithography of a pattern forming process using the composition, a forming method of a laminated structure used in nanoimprint lithography of a pattern forming process using the composition, and a forming method of a resist pattern for nanoimprint.

Means for Solving the Problem

As a result of assiduous research intended to solve these problems, the inventor of the present invention has found that a composition containing, as components, a polymerizable compound (A) having a small content of low molecular weight components and containing silicon atoms in a content of 5 to 45% by mass, a polymerization initiator (B), and a solvent (C) is suitable as a material for forming a resist underlayer film for nanoimprint, and has completed the present invention.

That is, the present invention is, according to a first aspect, a composition for forming a resist underlayer film used for nanoimprint in a pattern forming process using nanoimprint by performing heat-baking, light-irradiation, or both of them, the composition containing a silicon atom-containing polymerizable compound (A), a polymerization initiator (B), and a solvent (C);

according to a second aspect, the composition for forming the resist underlayer film according to the first aspect, in which the polymerizable compound (A) contains silicon atoms in a content of 5 to 45% by mass;

according to a third aspect, the composition for forming the resist underlayer film according to the first aspect or the second aspect, in which the polymerizable compound (A) is a polymerizable compound having at least one cation polymerizable reactive group, a polymerizable compound having at least one radical polymerizable reactive group, or both of them and the polymerization initiator (B) is a photopolymerization initiator;

according to a fourth aspect, the composition for forming the resist underlayer film according to the first aspect or the second aspect, in which the polymerizable compound (A) is a polymerizable compound having at least one cation polymerizable reactive group, a polymerizable compound having at least one radical polymerizable reactive group, or both of them and the polymerization initiator (B) is a thermopolymerization initiator;

according to a fifth aspect, the composition for forming the resist underlayer film according to the third aspect or the fourth aspect, in which the cation polymerizable reactive group is an epoxy group, an oxetane group, or an organic group containing any one of or both of them;

according to a sixth aspect, the composition for forming the resist underlayer film according to the third aspect or the fourth aspect, in which the radical polymerizable reactive group is a vinyl group or an organic group containing a vinyl group;

according to a seventh aspect, the composition for forming the resist underlayer film according to any one of the first aspect to the sixth aspect, in which the polymerizable compound (A) is a silicon atom-containing polymerizable compound (A1) containing at least one of organic silicon compound selected from a group consisting of an organic silicon compound of Formula (I):

$$(R^1)_a(R^3)_b Si(R^2)_{4-(a+b)} \quad \text{Formula (I)}$$

(where $R^1$ is an epoxy group, an oxetane group, a vinyl group, or a polymerizable organic group which contains one to three of an epoxy group, an oxetane group, and a vinyl group and is bonded to a silicon atom through a Si—C bond; $R^3$ is an alkyl group, an aryl group, a halogenated alkyl group, a halogenated aryl group, or an organic group which has a mercapto group, an amino group, or a cyano group and is bonded to a silicon atom through a Si—C bond; $R^2$ is a halogen atom, a $C_{1-8}$ alkoxy group, or an acyloxy group; and a is an integer of 1, b is an integer of 0, 1, or 2, where a+b is an integer of 1, 2, or 3) and an organic silicon compound of Formula (II):

$$[(R^4)_c Si(R^5)_{3-c}]_2 Y \quad \text{Formula (II)}$$

(where $R^4$ is an epoxy group, an oxetane group, a vinyl group, or a polymerizable organic group which contains one to three of an epoxy group, an oxetane group, and a vinyl group and is bonded to a silicon atom through a Si—C bond; $R^5$ is a halogen atom, a $C_{1-8}$ alkoxy group, or an acyloxy group; Y is an oxygen atom, a methylene group, or a $C_{2-20}$ alkylene group; and c is an integer of 1 or 2), a hydrolysis product thereof, a hydrolysis-condensation product thereof, or a mixture thereof;

according to an eighth aspect, the composition for forming the resist underlayer film according to any one of the first aspect to the sixth aspect, in which the polymerizable compound (A) is a combination of a silicon atom-containing polymerizable compound (A1) containing at least one of organic silicon compound selected from a group consisting of the organic silicon compound of Formula (I) and the organic silicon compound of Formula (II), a hydrolysis product thereof, a hydrolysis-condensation product thereof, or a mixture thereof, and a silicon atom-containing polymerizable compound (A2) containing at least one of organic silicon compound selected from a group consisting of an organic silicon compound of General Formula (III):

$$(R^{11})_{a^1}(R^{13})_{b^1}Si(R^{12})_{4-(a^1+b^1)} \quad \text{Formula (III)}$$

(where $R^{11}$ and $R^{13}$ are individually an alkyl group, an aryl group, a halogenated alkyl group, a halogenated aryl group, or an organic group which has a mercapto group, an amino group, or a cyano group and is bonded to a silicon atom through a Si—C bond; $R^{12}$ is a halogen atom, a $C_{1-8}$ alkoxy group, or an acyloxy group; and $a^1$ and $b^1$ are individually an integer of 0, 1, or 2, where $a^1+b^1$ is an integer of 0, 1, or 2) and
an organic silicon compound of Formula (IV):

$$[(R^{14})_{c^1}Si(X)_{3-c^1}]_2 Y \quad \text{Formula (IV)}$$

(where $R^{14}$ is a $C_{1-5}$ alkyl group; X is a halogen atom, a $C_{1-8}$ alkoxy group, or an acyloxy group; $Y^1$ is a methylene group or a $C_{2-20}$ alkylene group; and $c^1$ is an integer of 0 or 1), a hydrolysis product thereof, a hydrolysis-condensation product thereof, or a mixture thereof;

according to a ninth aspect, the composition for forming the resist underlayer film according to any one of the first aspect to the sixth aspect, in which the silicon atom-containing polymerizable compound (A) contains a combination of a polymerizable compound (A1) and a polymerizable compound (A2) in which an abundance ratio between silicon atoms in (A1) and silicon atoms in (A2) in a molar ratio is 100:0 to 50, and is a polymerizable organic group-having condensation product having a weight average molecular weight of 100 to 100,000 produced by hydrolyzing the polymerizable compound (A1) and the polymerizable compound (A2) and by condensing the resultant hydrolyzed products;

according to a tenth aspect, the composition for forming the resist underlayer film according to any one of the first aspect to the sixth aspect, in which the silicon atom-containing polymerizable compound (A): contains the organic silicon compound of Formula (I) or a combination of the organic silicon compound of Formula (I) and the organic silicon compound of Formula (III); contains an organic silicon compound in which a value of a+b or a value of a+b and a value of $a^1+b^1$ become(s) 1 in the organic silicon compound of Formula (I) or in both of the organic silicon compound of Formula (I) and the organic silicon compound of Formula (III) in a ratio of 5 to 75% by mass; and is a polymerizable organic group-having condensation product having a weight average molecular weight of 100 to 1,000,000 produced by hydrolyzing the above organic silicon compounds and by condensing the resultant hydrolyzed products;

according to an eleventh aspect, the composition for forming the resist underlayer film according to any one of the seventh aspect to the tenth aspect, in which the polymerizable compound (A) contains a thermally cation polymerizable reactive group and a photo radical polymerizable reactive group in a molar ratio of 10:90 to 90:10;

according to a twelfth aspect, the composition for forming the resist underlayer film according to any one of the first aspect to the eleventh aspect further containing a crosslinkable compound, a surface modifier, or both of them;

according to a thirteenth aspect, a forming method of a laminated structure used in a pattern forming process using nanoimprint, the forming method including: a process of applying the composition for forming the resist underlayer film as described in the first aspect to the twelfth aspect on a substrate to form a resist underlayer film; a process of performing heat-baking, light-irradiation, or both of them relative to the resist underlayer film to cure the resist underlayer film; and a process of applying a resist composition for nanoimprint on the resist underlayer film and heat-baking the resultant coating to form a resist for nanoimprint; according to a fourteenth aspect, a forming method of a laminated structure used in a pattern forming process using nanoimprint, the forming method including: a process of applying the composition for forming the resist underlayer film as described in the first aspect to the twelfth aspect on a substrate to form a resist underlayer film; a process of performing heat-baking, light-irradiation, or both of them relative to the resist underlayer film to cure the resist underlayer film; a process of applying a resist composition for nanoimprint on the resist underlayer film and heat-baking the resultant coating to form a resist for nanoimprint; and a process of imprinting by a step and repeat method;

according to a fifteenth aspect, the forming method according to the thirteenth aspect or the fourteenth aspect, in which the substrate is a substrate which has a hole having an aspect ratio represented by height/diameter of 0.01 or more or a step having an aspect ratio represented by height/width of 0.01 or more; and according to a sixteenth aspect, the forming method according to any one of the thirteenth aspect to the fifteenth aspect, in which the light-irradiation is performed by a light having a wavelength of 250 nm to 650 nm.

Effects of the Invention

A resist underlayer film obtained by performing heat-baking, light-irradiation, or both of them relative to the resist underlayer film forming composition of the present invention exhibits applying-type hardmask characteristics having a dry etching rate smaller than that of a resist under an oxygen gas condition and has a dry etching rate larger than that of a resist under a fluorine-based gas (such as $CF_4$) condition.

The resist underlayer film forming composition of the present invention contains silicon atoms that are an inorganic atom derived from an organic silicon compound in a content of 5 to 45% by mass, so that the plasma etching rate of the resist underlayer film forming composition by an oxygen gas becomes smaller and the resist underlayer film forming composition becomes an etching-resistant hardmask layer.

A fluorine-based gas (such as $CF_4$) used during etching according to a resist pattern of the resist underlayer film of the present invention has a satisfactorily high etching rate relative to the resist underlayer film of the present invention in comparison with an etching rate relative to a resist. Thus, it is possible that according to the resist pattern, the resist underlayer film of the present invention is removed by etching to transfer the resist pattern to the underlayer film of the present invention, and by using the formed resist film and the formed resist underlayer film as a protecting film, the substrate can be processed.

Further, a resist underlayer film obtained from the resist underlayer film forming composition exhibits high adhesion to a resist for nanoimprint and a base substrate and is excellent in peeling properties between a template and a resist for nanoimprint.

After a template having a fine convexo-concave shape is pressed against a resist for nanoimprint formed on the resist underlayer film to pressurize the resist and the resist composition is cured by light-irradiation or heat-baking while the composition is in a pressurized state, when the template is released from the coating film, by high adhesion between the underlayer film of the present invention and the resist for nanoimprint, it is less likely to cause a problem of a patterning loss such as chipping, collapse, and peeling of a resist pattern and foreign matters caused by reattachment of resist pieces.

The underlayer film of the present invention has excellent planarity and excellent surface smoothness and planarizes an unevenness of a base substrate, so that the underlayer film can homogenize the film thickness of a resist formed as an upper layer of the underlayer film, and as a result thereof, the underlayer film brings high resolution in a lithography process.

Further, the resist underlayer film of the present invention causes no intermixing with a resist formed as an upper layer of the resist underlayer film, is insoluble in a photoresist solvent, causes no diffusion of a low molecular weight substance from the underlayer film to the resist film as an upper layer of the resist underlayer film during application or heating-drying, and has an advantageous rectangular nano-patterning characteristic.

Depending on the application, when photo-crosslinking is applied to the resist underlayer film forming composition of the present invention, the resist underlayer film can be formed by light-irradiation without performing heat-baking at a high temperature. Therefore, a contamination of peripheral equipment by volatilization or sublimation of a low molecular weight component can be prevented. Further, heat-baking at a high temperature is not required, so that when a low molecular weight component is used in the resist underlayer film forming composition, there is no fear of sublimation or the like and a relatively large amount of a low molecular weight component can be used in the resist underlayer film forming composition. Therefore, by using a resist underlayer film forming composition having a relatively low viscosity, the resist underlayer film can be formed. Then, there can also be formed a resist underlayer film further more excellent in filling properties of a hole and planarizing properties of a semiconductor substrate.

By the forming method of a laminated structure used in a pattern forming process using nanoimprint of the present invention, in processing of a substrate, a high resolution is achieved and it is also possible to process a substrate having a large aspect ratio.

MODES FOR CARRYING OUT THE INVENTION

The present invention is a composition for forming a resist underlayer film for nanoimprint in a pattern forming process using nanoimprint by performing heat-baking, light-irradiation, or both of them. The composition for forming a resist underlayer film for nanoimprint containins a silicon atom-containing polymerizable compound (A), a polymerization initiator (B), and a solvent (C).

The polymerizable compound (A) is a polymerizable organic group-containing organic silicon compound, a hydrolysis product of the polymerizable organic group-containing organic silicon compound, a condensation product of the hydrolysis product of the polymerizable organic group-containing organic silicon compound, or a mixture thereof.

The polymerizable compound (A) is a polymerizable compound having at least one cation polymerizable reactive group, a polymerizable compound having at least one radical polymerizable reactive group, or a combination thereof, and as the polymerization initiator (B), a photopolymerization initiator can be used.

By irradiating an underlayer film containing the polymerizable compound (A) with light and by an action of a photo cation polymerization initiator, the cation polymerization of the polymerizable compound (A) is progressed to form an underlayer film. Then, the cation polymerizable reactive group is preferably an epoxy group, an oxetane group, or an organic group containing any one of or both of them. When the polymerizable compound (A) is the condensation product, it is preferred, in terms of the solvent-dissolution resistance to a solvent of an overcoated photoresist, that the condensation product have two or more epoxy groups that are a polymerizable moiety.

The polymerizable compound (A) is a polymerizable compound having at least one radical polymerizable ethylenic unsaturated bond such as a vinyl group and an organic group containing a vinyl group, and as the photopolymerization initiator, a photo radical polymerization initiator can be used. By irradiating an underlayer film containing the polymerizable compound (A) with light and by an action of the photo radical polymerization initiator, the radical polymerization of the polymerizable compound (A) is progressed to form the underlayer film. Then, the ethylenic unsaturated bond is preferably a vinyl group. The vinyl group is preferably an organic group containing an acryloxy group or a methacryloxy group. When the polymerizable compound (A) is the condensation product, it is preferred, in terms of the solvent-dissolution resistance of the resist underlayer film relative to a solvent of an overcoated photoresist, that the condensation product have two or more vinyl groups that are a polymerizable moiety.

For the cation polymerization, a thermo cation polymerization initiator or a photo cation polymerization initiator can be used.

For the radical polymerization, a thermo radical polymerization initiator or a photo radical polymerization initiator can be used.

As the polymerizable compound (A), there can be used a combination of a polymerizable compound having at least one cation polymerizable reactive group and a polymerizable compound having at least one radical polymerizable reactive group, and as the polymerization initiator (B), a photopolymerization initiator can be used. By irradiating the resist underlayer film with light, the photo cation polymerization and the photo radical polymerization are progressed to form the resist underlayer film. By performing heat-baking before performing light-irradiation, the thermopolymerization is progressed and then, by performing light-irradiation, the photo cation polymerization and the photo radical polymerization are progressed, so that the resist underlayer film can also be formed.

By performing heat-baking before performing light-irradiation, the thermopolymerization by a cation polymerizable reactive group (such as an epoxy group and an epoxy group-containing organic group) is progressed and then, by performing light-irradiation, the photo radical polymerization by a radical polymerizable reactive group (a vinyl group or a vinyl group-containing organic group) is progressed, so that the resist underlayer film can also be formed.

The polymerizable compound (A) may contain a thermally cation polymerizable reactive group and a photo radical polymerizable reactive group in a ratio of 10:90 to 90:10.

Before the photopolymerization is performed, the contact angle of the surface of the resist underlayer film is high, so that when the resist underlayer film forming composition is applied on a substrate, the liquid easily spreads on the surface of the substrate. Then, after the photopolymerization is performed, the contact angle of the surface of the resist underlayer film becomes lower, so that the resist underlayer film is excellent in the adhesion thereof to a resist film overcoated on the surface of the resist underlayer film. The adhesion is easily influenced particularly by a vinyl group and there can be used a method for enhancing the adhesion of the resist underlayer film to the overcoated resist. The method includes: enhancing the contact angle of the resist underlayer film before performing the photo radical polymerization to spread the resist underlayer film forming composition on the substrate and to satisfactorily enhance the planarity of the resist underlayer film; and then lowering the contact angle of the resist underlayer film after performing the photo radical polymerization.

In the present invention, as the silicon atom-containing polymerizable compound (A), there can be used a silicon atom-containing polymerizable compound (A1) containing at least one of organic silicon compound selected from a group consisting of an organic silicon compound of Formula (I):

$$(R^1)_a(R^3)_b Si(R^2)_{4-(a+b)} \qquad \text{Formula (I)}$$

(where $R^1$ is an epoxy group, an oxetane group, a vinyl group, or a polymerizable organic group which contains one to three of an epoxy group, an oxetane group, and a vinyl group and is bonded to a silicon atom through a Si—C bond; $R^3$ is an alkyl group, an aryl group, a halogenated alkyl group, a halogenated aryl group, or an organic group which has a mercapto group, an amino group, or a cyano group and is bonded to a silicon atom through a Si—C bond; $R^2$ is a halogen atom, a $C_{1-8}$ alkoxy group, or an acyloxy group; and a is an integer of 1, b is an integer of 0, 1, or 2, where a+b is an integer of 1, 2, or 3) and an organic silicon compound of Formula (II):

$$[(R^4)_c Si(R^5)_{3-c}]_2 Y \qquad \text{Formula (II)}$$

(where $R^4$ is an epoxy group, an oxetane group, a vinyl group, or a polymerizable organic group which contains one to three of an epoxy group, an oxetane group, and a vinyl group and is bonded to a silicon atom through a Si—C bond; $R^5$ is a halogen atom, a $C_{1-8}$ alkoxy group, or an acyloxy group; Y is an oxygen atom, a methylene group, or a $C_{2-20}$ alkylene group; and c is an integer of 1 or 2), a hydrolysis product thereof, a hydrolysis-condensation product thereof, or a mixture thereof.

Preferred examples of the organic silicon compound of Formula (I) corresponding to the polymerizable compound (A1) include: a vinyl group-containing silane compound such as methacrylamidetrimethoxysilane, 2-methacryloxyethyltrimethoxysilane, (methacryloxymethyl)bis(trimethyloxy)methylsilane, methacryloxymethyltriethoxysilane, methacryloxymethyltrimethoxysilane, 3-methacryloxypropyldimethylchlorosilane, 2-methacryloxyethyltrimethoxysilane, 3-methacryloxypropyldimethylethoxysilane, 3-methacryloxypropyldimethylmethoxysilane, 3-methacryloxypropyltrichlorosilane, 3-methacryloxypropylmethyldiethoxysilane, 3-methacryloxypropylmethyldimethoxysilane, 3-methacryloxypropyltripropoxysilane, 3-methacryloxypropyltrichlorosilane, 3-methacryloxypropyltriethoxysilane, 3-methacryloxypropyltrimethoxysilane, 2-methacryloxypropyltrimethoxysilane, 3-methacryloxypropyltris(methoxyethyl)silane, methacryloxytrimethoxysilane, methacryloxytributoxysilane, methacryloxytriisopropoxysilane, methacryloxytriphenoxysilane, methacryloxyphenyldimethoxysilane, methacryloxyphenylmethylmethoxysilane, methacryloxyphenyldichlorosilane, methacryloxyphenyldimethylsilane, methacryloxyphenyldiethoxysilane, methacryloxyphenyldichlorosilane, methacryloxytrimethoxysilane, methacryloxymethyldimethoxysilane, methacryloxymethyldiethoxysilane, methacryloxymethyldiacetoxysilane, methacryloxydiphenylchlorosilane, acrylamidetrimethoxysilane, 2-acryloxyethyltrimethoxysilane, (acryloxymethyl)bis(trimethyloxy)methylsilane, acryloxymethyltriethoxysilane, acryloxymethyltrimethoxysilane, 3-acryloxypropyldimethylchlorosilane, 2-acryloxyethyltrimethoxysilane, 3-acryloxypropyldimethylethoxysilane, 3-acryloxypropyldimethylmethoxysilane, 3-acryloxypropyltrichlorosilane, 3-acryloxypropylmethyldiethoxysilane, 3-acryloxypropylmethyldimethoxysilane, 3-acryloxypropyltripropoxysilane, 3-acryloxypropyltrichlorosilane, 3-acryloxypropyltriethoxysilane, 3-acryloxypropyltrimethoxysilane, 2-acryloxypropyltrimethoxysilane, 3-acryloxypropyltris(methoxyethyl)silane, acryloxytrimethoxysilane, acryloxytributoxysilane, acryloxytriisopropoxysilane, acryloxytriphenoxysilane, acryloxyphenyldimethoxysilane, acryloxyphenylmethylmethoxysilane, acryloxyphenyldichlorosilane, acryloxyphenyldimethoxysilane, acryloxyphenyldiethoxysilane, acryloxyphenyldichlorosilane, acryloxytrimethoxysilane, acryloxymethyldimethoxysilane, acryloxymethyldiethoxysilane, acryloxymethyldiacetoxysilane, and acryloxydiphenylchlorosilane;

and an epoxy group-containing silane compound such as glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, and γ-glycidoxypropylvinyldiethoxysilane.

Preferred examples of the organic silicon compound of Formula (II) corresponding to the polymerizable compound (A1) include: an epoxy group-containing silane compound such as bis[2-(3,4-epoxycyclohexyl)ethyl]tetramethyldisiloxane, di(glycidoxypropyl)tetramethyldisiloxane, and di(glycidoxypropyl)tetraphenyldisiloxane; and a vinyl group-containing silane compound such as di(3-methacryloxypropyl)tetramethyldisiloxane, di(3-methacryloxypropyl)tetraphenyldisiloxane, di(3-acryloxypropyl)tetramethyldisiloxane, and di(3-acryloxypropyl)tetraphenyldisiloxane.

Preferred examples of the organic silicon compound of Formula (II) corresponding to the polymerizable compound (A1) include: an epoxy group-containing silane compound such as bis[2-(3,4-epoxycyclohexyl)ethyl]tetramethyldisiloxane, di(glycidoxypropyl)tetramethyldisiloxane, and di(glycidoxypropyl)tetraphenyldisiloxane; and a vinyl group-containing silane compound such as di(3-methacryloxypropyl)tetramethyldisiloxane, di(3-methacryloxypropyl)tetraphenyldisiloxane, di(3-acryloxypropyl)tetramethyldisiloxane, and di(3-acryloxypropyl)tetraphenyldisiloxane.

The polymerizable compound (A1) is a silicon atom-containing polymerizable compound (A1) containing at least one of organic silicon compound selected from a group consisting of the organic silicon compound of Formula (I) and the organic silicon compound of Formula (II), a hydrolysis product thereof, a hydrolysis-condensation product thereof, or a mixture thereof.

In the present invention, for the purpose of improving etching resistance, wettability with the resist, gas permeability, preservation stability, wettability with the substrate, and the like of the resist underlayer film, the polymerizable compound (A1) can be combined with a silicon atom-containing polymerizable compound (A2) containing no polymerizable organic group such as an epoxy group and a vinyl group.

The silicon atom-containing polymerizable compound (A2) is a silicon atom-containing compound containing at least one of organic silicon compound selected from a group consisting of an organic silicon compound of General Formula (III):

$(R^{11})_{a^1}(R^{13})_{b^1}Si(R^{12})_{4-(a^1+b^1)}$  Formula (III)

(where $R^{11}$ and $R^{13}$ are individually an alkyl group, an aryl group, a halogenated alkyl group, a halogenated aryl group, or an organic group which has a mercapto group, an amino group, or a cyano group and is bonded to a silicon atom through a Si—C bond; $R^{12}$ is a halogen atom, a $C_{1-8}$ alkoxy group, or an acyloxy group; and a and b are individually an integer of 0, 1, or 2, where a+b is an integer of 0, 1, or 2) and an organic silicon compound of Formula (IV):

$[(R^{14})_{c^1}Si(X)_{3-c^1}]_2Y$  Formula (IV)

(where $R^{14}$ is a $C_{1-5}$ alkyl group; X is a halogen atom, a $C_{1-8}$ alkoxy group, or an acyloxy group; Y is a methylene group or a $C_{2-20}$ alkylene group; and $c^1$ is an integer of 0 or 1), a hydrolysis product thereof, a hydrolysis-condensation product thereof, or a mixture thereof.

Preferred examples of the organic silicon compound of Formula (III) corresponding to the polymerizable compound (A2) include tetramethoxysilane, tetraethoxysilane, tetra n-propoxysilane, tetraisopropoxysilane, tetra n-butoxysilane, tetraacetoxysilane, methyltrimethoxysilane, methyltripropoxysilane, methyltriacetoxysilane, methyltributoxysilane, methyltripropoxysilane, methyltriamyloxysilane, methyltriphenoxysilane, methyltribenzyloxysilane, methyltriphenethyloxysilane, ethyltrimethoxysilane, ethyltriethoxysilane, phenyltrimethoxysilane, phenyltriethoxysilane, phenyltriacetoxysilane, γ-chloropropyltrimethoxysilane, γ-chloropropyltriethoxysilane, γ-chloropropyltriacetoxysilane, 3,3,3-trifluoropropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, N-(β-aminoethyl)γ-aminopropyltrimethoxysilane, N-(β-aminoethyl)γ-aminopropylmethyldimethoxysilane, γ-aminopropylmethyldimethoxysilane, N-(β-aminoethyl)γ-aminopropyltriethoxysilane, N-(β-aminoethyl)γ-aminopropylmethyldiethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, and methylvinyldiethoxysilane.

Preferred examples of the organic silicon compound of Formula (IV) corresponding to the polymerizable compound (A2) include methylenebismethyldimethoxysilane, ethylenebisethyldimethoxysilane, propylenebisethyldiethoxysilane, and butylenebismethyldiethoxysilane.

The polymerizable compound (A2) is a silicon atom-containing polymerizable compound (A2) containing at least one of organic silicon compound selected from a group consisting of the organic silicon compound of Formula (III) and the organic silicon compound of Formula (IV), a hydrolysis product thereof, a hydrolysis-condensation product thereof, or a mixture thereof.

In the present invention, the silicon atom-containing polymerizable compound (A) contains the polymerizable compound (A1) or a combination of the polymerizable compound (A1) and the polymerizable compound (A2). The molar ratio of the polymerizable compound (A1):the polymerizable compound (A2) in the polymerizable compound (A) is 100:0 to 50. The combination is preferably a condensation product having a weight average molecular weight of 100 to 100,000 and a polymerizable organic group and being produced by hydrolyzing the polymerizable compound (A1) and the polymerizable compound (A2) and by condensing the resultant hydrolyzed products.

For hydrolyzing and condensing the organic silicon compound, there is used water in an amount of more than 1 mole and 100 moles or less, preferably 1 mole to 50 moles, relative to 1 mole of a hydrolyzable group (such as a chlorine atom and an alkoxy group) of the organic silicon compound.

The production of the polymerizable compound (A) of the present invention is characterized in that when at least one of silane compound selected from the above compounds is hydrolyzed and condensed, a catalyst is used. Examples of the catalyst capable of being used in this case include a chelate compound of a metal such as titanium and aluminum, an acid catalyst, and an alkaline catalyst.

The silicon atom-containing polymerizable compound (A) contains the organic silicon compound of Formula (I) or a combination of the organic silicon compound of Formula (I) and the organic silicon compound of Formula (III), and is preferably a polymerizable organic group-having condensation product having a weight average molecular weight of 100 to 1,000,000 produced by hydrolyzing an organic silicon compound containing an organic silicon compound in which the value of a+b or the values of a+b and $a^1+b^1$ in the organic silicon compound of Formula (I) or in both of the organic silicon compound of Formula (I) and the organic silicon compound of Formula (III) become(s) 1 in a ratio of 5 to 75% by mass and by condensing the resultant hydrolyzed product.

The resist underlayer film forming composition of the present invention is produced ordinarily by dissolving or dispersing the polymerizable compound (A) in an organic solvent. The organic solvent is at least one selected from a group consisting of an alcohol solvent, a ketone solvent, an amide solvent, an ester solvent, and an aprotic solvent.

In the resist underlayer film forming composition of the present invention, there may be further blended a component such as β-diketone, colloidal silica, colloidal alumina, an organic polymer, a surfactant, a silane coupling agent, a radical generator, a triazene compound, and an alkaline compound.

The organic silicon compound used in the present invention is hydrolyzed and condensed ordinarily in an organic solvent.

Examples of the organic solvent used for the hydrolysis include: aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, di-isopropylbenzene, n-amylnaphthalene, and trimethylbenzene; monoalcohol solvents such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol;

polyalcohol solvents such as ethylene glycol, propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerin;

ketone solvents such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone;

ether solvents such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran;

ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate;

nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethylsulfoxide, sulfolane, and 1,3-propane sultone.

Particularly preferred are propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate, in terms of preservation solubility of the solution thereof.

When the organic silicon compound is hydrolyzed and condensed, a catalyst may be used. Examples of the catalyst used in this case include a metal chelate compound, an organic acid, an inorganic acid, an organic base, and an inorganic base. Examples of the metal chelate compound include: titanium chelate compounds such as triethoxy.mono(acetylacetonate)titanium, tri-n-propoxy.mono(acetylacetonate)titanium, tri-isopropoxy.mono(acetylacetonate)titanium, tri-n-butoxy.mono(acetylacetonate)titanium, tri-sec-butoxy.mono(acetylacetonate)titanium, tri-tert-butoxy.mono(acetylacetonate)titanium, diethoxy.bis(acetylacetonate)titanium, di-n-propoxy.bis(acetylacetonate)titanium, di-isopropoxy.bis(acetylacetonate)titanium, di-n-butoxy.bis(acetylacetonate)titanium, di-sec-butoxy.bis(acetylacetonate)titanium, di-tert-butoxy.bis(acetylacetonate)titanium, monoethoxy.tris(acetylacetonate)titanium, mono-n-propoxy.tris(acetylacetonate)titanium, mono-isopropoxy.tris(acetylacetonate)titanium, mono-n-butoxy.tris(acetylacetonate)titanium, mono-sec-butoxy.tris(acetylacetonate)titanium, mono-tert-butoxy.tris(acetylacetonate)titanium, tetrakis(acetylacetonate)titanium, triethoxy.mono(ethylacetoacetate)titanium, tri-n-propoxy.mono(ethylacetoacetate)titanium, tri-isopropoxy.mono(ethylacetoacetate)titanium, tri-n-butoxy.mono(ethylacetoacetate)titanium, tri-sec-butoxy.mono(ethylacetoacetate)titanium, tri-tert-butoxy.mono(ethylacetoacetate)titanium, diethoxy.bis(ethylacetoacetate)titanium, di-n-propoxy.bis(ethylacetoacetate)titanium, di-isopropoxy.bis(ethylacetoacetate)titanium, di-n-butoxy.bis(ethylacetoacetate)titanium, di-sec-butoxy.bis(ethylacetoacetate)titanium, di-tert-butoxy.bis(ethylacetoacetate)titanium, monoethoxy.tris(ethylacetoacetate)titanium, mono-n-propoxy.tris(ethylacetoacetate)titanium, mono-isopropoxy.tris(ethylacetoacetate)titanium, mono-n-butoxy.tris(ethylacetoacetate)titanium, mono-sec-butoxy.tris(ethylacetoacetate)titanium, mono-tert-butoxy.tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, and tris(acetylacetonate)mono(ethylacetoacetate)titanium;

zirconium chelate compounds such as triethoxy.mono(acetylacetonate)zirconium, tri-n-propoxy.mono(acetylacetonate)zirconium, tri-isopropoxy.mono(acetylacetonate)zirconium, tri-n-butoxy.mono(acetylacetonate)zirconium, tri-sec-butoxy.mono(acetylacetonate)zirconium, tri-tert-butoxy.mono(acetylacetonate)zirconium, diethoxy.bis(acetylacetonate)zirconium, di-n-propoxy.bis(acetylacetonate)zirconium, di-isopropoxy.bis(acetylacetonate)zirconium, di-n-butoxy.bis(acetylacetonate)zirconium, di-sec-butoxy.bis(acetylacetonate)zirconium, di-tert-butoxy.bis(acetylacetonate)zirconium, monoethoxy.tris(acetylacetonate)zirconium, mono-n-propoxy.tris(acetylacetonate)zirconium, mono-isopropoxy.tris(acetylacetonate)zirconium, mono-n-butoxy.tris(acetylacetonate)zirconium, mono-sec-butoxy.tris(acetylacetonate)zirconium, mono-tert-butoxy.tris(acetylacetonate)zirconium, tetrakis(acetylacetonate)zirconium, triethoxy.mono(ethylacetoacetate)zirconium, tri-n-propoxy.mono(ethylacetoacetate)zirconium, tri-isopropoxy.mono(ethylacetoacetate)zirconium, tri-n-butoxy.mono(ethylacetoacetate)zirconium, tri-sec-butoxy.mono(ethylacetoacetate)zirconium, tri-tert-butoxy.mono(ethylacetoacetate)zirconium, diethoxy.bis(ethylacetoacetate)zirconium, di-n-propoxy.bis(ethylacetoacetate)zirconium, di-isopropoxy.bis(ethylacetoacetate)zirconium, di-n-butoxy.bis(ethylacetoacetate)zirconium, di-sec-butoxy.bis(ethylacetoacetate)zirconium, di-tert-butoxy.bis(ethylacetoacetate)zirconium, monoethoxy.tris(ethylacetoacetate)zirconium, mono-n-propoxy.tris(ethylacetoacetate)zirconium, mono-isopropoxy.tris(ethylacetoacetate)zirconium, mono-n-butoxy.tris(ethylacetoacetate)zirconium, mono-sec-butoxy.tris(ethylacetoacetate)zirconium, mono-tert-butoxy.tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium, and tris(acetylacetonate)mono(ethylacetoacetate)zirconium; and aluminum chelate compounds such as tris(acetylacetonate)aluminum and tris(ethylacetoacetate)aluminum.

Examples of the organic acid include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid. Examples of the inorganic acid include hydrochloric acid, nitric acid, sulfuric acid, hydrofluoric acid, and phosphoric acid. Examples of the organic base include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclo octane, diazabicyclo nonane, diazabicyclo undecene, and tetramethylammonium hydroxide. Examples of the inorganic base include ammonia, sodium hydroxide, potassium hydroxide, barium hydroxide, and calcium hydroxide. Among these catalysts, metal chelate compounds, organic acids, and inorganic acids are preferred and more preferred are titanium chelate compounds and organic acids. These catalysts may be used individually or in combination of two or more types thereof.

Further, for enhancing adhesion to the resist, wettability with the base substrate, flexibility, planarity, and the like of the underlayer film, if necessary, polymerizable compounds containing no silicon atom below may be used to be copolymerized (hybridization) or mixed with the above silicon atom-containing polymerizable compounds.

Specific examples of the ethylenic unsaturated bond-having polymerizable compound containing no silicon atom include ethylene glycol di(meth)acrylate, diethylene glycol di(meth)acrylate, triethylene glycol di(meth)acrylate, tetraethylene glycol di(meth)acrylate, nonaethylene glycol di(meth)acrylate, polyethylene glycol di(meth)acrylate, tripropylene glycol di(meth)acrylate, tetrapropylene glycol di(meth)acrylate, nonapropylene glycol di(meth)acrylate, polypropylene glycol di(meth)acrylate, 2,2-bis[4-(acryloxydiethoxy)phenyl]propane, 2,2-bis[4-(methacryloxydiethoxy)phenyl]propane, 3-phenoxy-2-propanoyl acrylate, 1,6-bis(3-acryloxy-2-hydroxypropyl)-hexyl ether, pentaerythritol tri(meth)acrylate, trimethylolpropane tri(meth)acrylate, glycerol tri(meth)acrylate, tris-(2-hydroxyethyl)-isocyanuric acid ester(meth)acrylate, pentaerythritol tetra(meth)acrylate, dipentaerythritol penta(meth)acrylate, and dipentaerythritol hexa(meth)acrylate. Here, ethylene glycol di(meth)acrylate means ethylene glycol diacrylate and ethylene glycol dimethacrylate.

Examples of the ethylenic unsaturated bond-having polymerizable compound containing no silicon atom also include urethane compounds that can be obtained by a reaction between a multivalent isocyanate compound and a hydroxyalkyl unsaturated carboxylic acid ester compound, compounds that can be obtained by a reaction between a multivalent epoxy compound and a hydroxyalkyl unsaturated carboxylic acid ester compound, diallyl ester compounds such as diallyl phthalate, and divinyl compounds such as divinyl phthalate.

Examples of the cation polymerizable moiety-having polymerizable compound containing no silicon atom include a compound having a cyclic ether structure such as an epoxy ring and an oxetane ring, a vinyl ether structure, a vinyl thioether structure, or the like.

Although the epoxy ring-having polymerizable compound containing no silicon atom is not particularly limited, as such a polymerizable compound, a compound having one to six, or two to four epoxy ring(s) can be used. Examples of the epoxy ring-having polymerizable compound include compounds having two or more glycidyl ether structures or glycidyl ester structures that can be produced from a compound having two or more hydroxy groups or carboxy groups such as diol compounds, triol compounds, dicarboxylic acid compounds, and tricarboxylic acid compounds and a glycidyl compound such as epichlorohydrin.

Specific examples of the epoxy ring-having polymerizable compound containing no silicon atom include 1,4-butanediol diglycidyl ether, 1,2-epoxy-4-(epoxyethyl)cyclohexane, glycerol triglycidyl ether, diethylene glycol diglycidyl ether, 2,6-diglycidylphenyl glycidyl ether, 1,1,3-tris[p-(2,3-epoxypropoxyl)phenyl]propane, 1,2-cyclohexane dicarboxylic acid diglycidyl ester, 4,4'-methylenebis(N,N-diglycidylaniline), 3,4-epoxycyclohexylmethyl-3,4-epoxycyclohexane carboxylate, trimethylolethane triglycidyl ether, triglycidyl-p-aminophenol, tetraglycidyl meta-xylenediamine, tetraglycidyldiaminodiphenylmethane, tetraglycidyl-1,3-bisaminomethylcyclohexane, bisphenol-A-diglycidyl ether, bisphenol-S-diglycidyl ether, pentaerythritol tetraglycidyl ether, resorcinol diglycidyl ether, phthalic acid diglycidyl ester, neopentyl glycol diglycidyl ether, polypropylene glycol diglycidyl ether, tetrabromobisphenol-A-diglycidyl ether, bisphenolhexafluoroacetone glycidyl ether, pentaerythritol diglycidyl ether, tris-(2,3-epoxypropyl)isocyanurate, monoallyl diglycidyl isocyanurate, diglycerol polydiglycidyl ether, pentaerythritol polyglycidyl ether, 1,4-bis(2,3-epoxypropoxyperfluoroisopropyl)cyclohexane, sorbitol polyglycidyl ether, trimethylolpropane polyglycidyl ether, resorcin diglycidyl ether, 1,6-hexanediol diglycidyl ether, polyethylene glycol diglycidyl ether, phenyl glycidyl ether, p-tert-butylphenyl glycidyl ether, adipic acid diglycidyl ether, o-phthalic acid diglycidyl ether, dibromophenyl glycidyl ether, 1,2,7,8-diepoxyoctane, 1,6-dimethylolperfluorohexane diglycidyl ether, 4,4'-bis(2,3-epoxypropoxyperfluoroisopropyl)diphenyl ether, 2,2-bis(4-glycidyloxyphenyl)propane, 3,4-epoxycyclohexylmethyl-3',4'-epoxycyclohexane carboxylate, 3,4-epoxycyclohexyloxirane, 2-(3,4-epoxycyclohexyl)-3',4'-epoxy-1,3-dioxane-5-spirocyclohexane, 1,2-ethylenedioxybis(3,4-epoxycyclohexylmethane), 4',5'-epoxy-2'-methylcyclohexylmethyl-4,5-epoxy-2-methylcyclohexane carboxylate, ethylene glycol-bis(3,4-epoxycyclohexane carboxylate), bis-(3,4-epoxycyclohexylmethyl)adipate, and bis (2,3-epoxycyclopentyl) ether.

Although the oxetane ring-having polymerizable compound containing no silicon atom is not particularly limited, as such a polymerizable compound, a compound having one to six, or two to four oxetane ring(s) can be used.

Examples of the oxetane ring-having polymerizable compound containing no silicon atom include 3-ethyl-3-hydroxymethyloxetane, 3-ethyl-3-(phenoxymethyl)oxetane, 3,3-diethyloxetane, 3-ethyl-3-(2-ethylhexyloxymethyl)oxetane, 1,4-bis(((3-ethyl-3-oxetanyl)methoxy)methyl)benzene, di((3-ethyl-3-oxetanyl)methyl) ether, and pentaerythritoltetrakis((3-ethyl-3-oxetanyl)methyl) ether.

Although the vinyl ether structure-having polymerizable compound containing no silicon atom is not particularly limited, as such a polymerizable compound, a compound having one to six, or two to four vinyl ether structure(s) can be used.

Examples of the vinyl ether structure-having polymerizable compound containing no silicon atom include vinyl-2-chloroethyl ether, vinyl-n-butyl ether, 1,4-cyclohexanedimethanol divinyl ether, vinyl glycidyl ether, bis(4-(vinyloxymethyl)cyclohexylmethyl) glutarate, tri(ethyleneglycol)divinyl ether, adipic acid divinyl ester, diethylene glycol divinyl ether, tris(4-vinyloxy)butyl trimellirate, bis(4-(vinyloxy)butyl) terephthalate, bis(4-(vinyloxy)butyl isophthalate, ethylene glycol divinyl ether, 1,4-butanediol divinyl ether, tetramethylene glycol divinyl ether, tetraethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, and cyclohexanedimethanol divinyl ether.

The polymerization initiator (B) in the underlayer film forming composition of the present invention is not particularly limited so long as the polymerization initiator (B) is a polymerizable compound having an action capable of initiating the polymerization of the polymerizable compound by heat-baking or light-irradiation. As the polymerization initiator (B), a compound generating an acid (a Brønsted acid or a Lewis acid), a base, a radical, or a cation by light-irradiation or heat-baking can be used.

Examples of the polymerization initiator (B) include: a compound capable of generating an active radical by light-irradiation to effect radical polymerization of the polymerizable compound, that is, a photo radical polymerization initiator; and a compound capable of generating a cation species such as a protonic acid and a carbon cation by light-irradiation to effect cation polymerization of the polymerizable compound, that is, a photo cation polymerization initiator.

The light-irradiation can be performed using, for example, a light having a wavelength of 150 nm to 1,000 nm, or 200 to 700 nm, or 300 to 600 nm. Then, as the photopolymerization initiator, there is preferably used a photo radical polymerization initiator generating an active radical or a photo cation polymerization initiator generating a cation species by an exposure dose of 1 to 2,000 mJ/cm$^2$, or 10 to 1,500 mJ/cm$^2$, or 50 to 1,000 mJ/cm$^2$.

Examples of the photo radical polymerization initiator include an imidazole compound, a diazo compound, a bisimidazole compound, an N-arylglycine compound, an organic azide compound, a titanocene compound, an aluminate compound, an organic peroxide, an N-alkoxypyridinium salt compound, and a thioxanthone compound.

Examples of the azide compound include p-azidebenzaldehyde, p-azideacetophenone, p-azidebenzoic acid, p-azidebenzalacetophenone, 4,4'-diazidechalcone, 4,4'-diazidediphenyl sulfide, and 2,6-bis(4'-azidebenzal)-4-methylcyclohexanone.

Examples of the diazo compound include 1-diazo-2,5-diethoxy-4-p-tolylmercaptobenzene borofluoride, 1-diazo-4-N,N-dimethylaminobenzene chloride, and 1-diazo-4-N,N-diethylaminobenzene borofluoride.

Examples of the bisimidazole compound include 2,2'-bis(o-chlorophenyl)-4,5,4',5'-tetrakis(3,4,5-trimethoxyphenyl) 1,2'-bisimidazole and 2,2'-bis(o-chlorophenyl) 4,5,4',5'-tetraphenyl-1,2'-bisimidazole.

Examples of the titanocene compound include dicyclopentadienyl-titanium-dichloride, dicyclopentadienyl-titanium-bisphenyl, dicyclopentadienyl-titanium-bis(2,3,4,5,6-pentafluorophenyl), dicyclopentadienyl-titanium-bis(2,3,5, 6-tetrafluorophenyl), dicyclopentadienyl-titanium-bis(2,4,6-trifluorophenyl), dicyclopentadienyl-titanium-bis(2,6-difluorophenyl), dicyclopentadienyl-titanium-bis(2,4-difluorophenyl), bis(methylcyclopentadienyl)-titanium-bis(2,3,4,5,6-pentafluorophenyl), bis(methylcyclopentadienyl)-titanium-bis(2,3,5,6-tetrafluorophenyl), bis(methylcyclopentadienyl)-titanium-bis(2,6-difluorophenyl), and dicyclopentadienyl-titanium-bis(2,6-difluoro-3-(1H-pyrrole-1-yl)-phenyl).

Examples of the photo radical polymerization initiator also include 1,3-di(tert-butyldioxycarbonyl)benzophenone, 3,3',4,4'-tetrakis(tert-butyldioxycarbonyl)benzophenone, 3-phenyl-5-isoxazolone, 2-mercaptobenzimidazole, 2,2-dimethoxy-1,2-diphenylethane-1-one, 1-hydroxy-cyclohexyl-phenyl-ketone, and 2-benzyl-2-dimethylamino-1-(4-morpholinophenyl)-butanone.

Examples of the photo cation polymerization initiator include sulfonic acid ester, a sulfonimide compound, a disulfonyldiazomethane compound, a dialkyl-4-hydroxysulfonium salt, an arylsulfonic acid-p-nitrobenzyl ester, a silanol-aluminum complex, and (η6-benzene)(η5-cyclopentadienyl) iron(II).

Examples of the sulfonimide compound include N-(trifluoromethanesulfonyloxy)succinimide, N-(nonafluoro-n-butanesulfonyloxy)succinimide, N-(camphorsulfonyloxy) succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

Examples of the photo cation polymerization initiator also include 2-methyl-1-(4-methylthiophenyl)-2-morpholinopropane-1-one.

An aromatic iodonium salt compound, an aromatic sulfonium salt compound, an aromatic diazonium salt compound, an aromatic phosphonium salt compound, a triazine compound, and an iron arene complex compound can be used both as a photo radical polymerization initiator and as a photo cation polymerization initiator.

Examples of the aromatic iodonium salt compound include diphenyliodoniumhexafluorophosphate, diphenyliodoniumtrifluoromethanesulfonate, diphenyliodoniumnonafluoro-n-butanesulfonate, diphenyliodoniumperfluoro-n-octanesulfonate, diphenyliodoniumcamphorsulfonate, bis(4-tert-butylphenyl)iodoniumcamphorsulfonate, and bis(4-tert-butylphenyl)iodoniumtrifluoromethanesulfonate.

Examples of the aromatic sulfonium salt compound include triphenylsulfoniumhexafluoroantimonate, triphenylsulfoniumnonafluoro n-butanesulfonate, triphenylsulfoniumcamphorsulfonate, and triphenylsulfoniumtrifluoromethanesulfonate.

In the resist underlayer film forming composition of the present invention, the photopolymerization initiators may be used individually or in combination of two or more types thereof.

Further, as a compound capable of generating a cation or a radical by heat-baking (heating) to effect a thermopolymerization reaction of the polymerizable compound, there can be blended in the composition an acid compound such as p-toluenesulfonic acid, trifluoromethanesulfonic acid, pyridinium p-toluenesulfonic acid, salicylic acid, sulfosalicylic acid, citric acid, benzoic acid, and hydroxybenzoic acid, or an acid generator such as 2,4,4,6-tetrabromocyclohexadienone, benzoin tosylate, 2-nitrobenzyl tosylate, bis(4-tert-butylphenyl)iodoniumtrifluoromethane sulfonate, triphenylsulfoniumtrifluoromethane sulfonate, phenyl-bis(trichloromethyl)-s-triazine, benzoin tosylate, and N-hydroxysuccinimidetrifluoromethane sulfonate. The condition for baking is accordingly selected from the baking temperatures of 60° C. to 300° C. and the baking times of 0.3 to 90 minutes.

As the contents of the polymerizable compound (A) and the polymerization initiator (B) in the resist underlayer film forming composition of the present invention, the content of the polymerization initiator (B) is, for example, 1 to 20 part(s) by mass, or 3 to 10 parts by mass, relative to 100 parts by mass of the polymerizable compound (A). When the content of the polymerization initiator (B) is less than this amount, the polymerization reaction is not satisfactorily progressed and the hardness and the wear resistance of the resultant underlayer film may become unsatisfactory. When the content of the polymerization initiator becomes more than this amount, curing is caused only in the vicinity of the surface of the resist underlayer film, so that it may become difficult that the inside of the underlayer film is completely cured. Further, in the case where heat-baking is applied, when the content of the polymerization initiator becomes more than this amount, the amount of a sublimated polymerization initiator increases, which becomes a cause of contamination of the inside of a baking oven.

In the resist underlayer film forming composition of the present invention, when, as the polymerizable compound, a compound having an ethylenic unsaturated bond that is a radical polymerizable moiety is used, a photo radical polymerization initiator is preferably used as the polymerization initiator. When, as the polymerizable compound, a compound having a vinyl ether structure, an epoxy ring, or an oxetane ring that is a cation polymerizable moiety is used, a photo cation polymerization initiator is preferably used as the polymerization initiator. As the polymerizable compound for heat-baking, when a compound having a silanol group is used, triphenylsulfoniumtrifluoromethane sulfonate and pyridinium p-toluenesulfonic acid are preferably used as the polymerization initiator.

In the resist underlayer film forming composition of the present invention, there may be blended, besides the polymerizable compound (A) and the polymerization initiator (B), if necessary, a surfactant, a sensitizer, an amine compound, a polymer compound, an antioxidant, a thermopolymerization inhibitor, a surface modifier, a defoaming agent, and the like.

By blending a surfactant in the resist underlayer film forming composition, the formation of a pinhole, a striation, and the like can be suppressed and applicability of the underlayer film forming composition can be enhanced. Examples of the surfactant include: a polyoxyethylene alkyl ether compound such as polyoxyethylene lauryl ether, polyoxyethylene stearyl ether, and polyoxyethylene oleyl ether; a polyoxyethylene alkylallyl ether compound such as polyoxyethylene octylphenol ether and polyoxyethylene nonylphenol ether; a polyoxyethylene-polyoxypropylene block copolymer compound; a sorbitan fatty acid ester compound such as sorbitan monolaurate, sorbitan monopalmitate, sorbitan monostearate, sorbitan trioleate, and sorbitan tristearate; and a polyoxyethylene sorbitan fatty acid ester compound such as polyoxyethylene sorbitan monolaurate, polyoxyethylene sorbitan monopalmitate, polyoxyethylene sorbitan monostearate, and polyoxyethylene sorbitan tristearate. Examples of the surfactant also include: a fluorinated surfactant such as EFTOP EF301, EF303, and EF352 (trade name; manufactured by Tohkem Products Corp.), MEGAFAC F171, F173, R-08, and R-30 (trade name; manufactured by Dainippon Ink and Chemicals, Inc.), Fluorad FC430 and FC431 (manufactured by Sumitomo 3M Limited), AsahiGuard AG710 and Surflon S-382, SC101, SC102, SC103, SC104, SC105, and SC106 (trade name; manufactured by Asahi Glass Co., Ltd.); and Organosiloxane polymer KP341 (manufactured by Shin-Etsu Chemical Co., Ltd.). When the surfactant is used, the additive amount thereof is, for example, 0.1 to 5 parts by mass, or 0.5 to 2 parts by mass, relative to 100 parts by mass of the polymerizable compound (A).

The sensitizer can be used for enhancing the sensitivity of the photopolymerization initiator relative to light. Examples of the sensitizer include: a pyrromethene complex compound such as 2,6-diethyl-1,3,5,7,8-pentamethylpyrromethene-$BF_2$ complex and 1,3,5,7,8-pentamethylpyrromethene-$BF_2$ complex; a xanthene-based dye such as eosin, ethyleosin, erythrosine, fluorescein, and rose bengal; a ketothiazoline compound such as 1-(1-methylnaphtho[1,2-d]thiazole-2(1H)-ylidene-4-(2,3,6,7)tetrahydro-1H,5H-benzo[ij]quinolizine-9-yl)-3-butene-2-one, and 1-(3-methylbenzothiazole-2(3H)-ylidene-4-(p-dimethylaminophenyl)-3-butene-2-one; and a styryl or phenylbutadienyl heterocyclic compound such as 2-(p-dimethylaminostyryl)-naphtho[1,2-d]thiazole and 2-[4-(p-dimethylaminophenyl)-1,3-butadienyl]-naphtho[1,2-d]thiazole. Examples of the sensitizer also include 2,4-diphenyl-6-(p-dimethylaminostyryl)-1,3,5-triazine, 2,4-diphenyl-6-(([2,3,6,7]tetrahydro-1H,5H-benzo[ij]quinolizine-9-yl)-1-ethene-2-yl)-1,3,5-triazonenanthryl-(([2,3,6,7]tetrahydro-1H,5H-benzo[ij]quinolizine-9-yl)-1-ethene-2-yl) ketone, 2,5-bis(p-dimethylaminocinnamylidene)cyclopentanone, and 5,10,15,20 tetraphenylporphyrin. When the sensitizer is used, the additive amount thereof is, for example, 0.1 to 20 parts by mass, relative to 100 parts by mass of the polymerizable compound (A).

The amine compound can be used for preventing the lowering of the sensitivity of the photopolymerization initiator due to oxygen inhibition. As the amine compound, various amine compounds such as aliphatic amine compounds and aromatic amine compounds can be used. When the amine compound is used, the additive amount thereof is, for example, 0.1 to 10 parts by mass, relative to 100 parts by mass of the polymerizable compound (A).

A polymer compound can be blended in the composition. As the polymer compound, the type thereof is not particularly limited and there can be used various polymer compounds having a weight average molecular weight of around 1,000 to 1,000,000. Examples of the polymer include an acrylate polymer, a methacrylate polymer, a novolac polymer, a styrene polymer, a polyamide, a polyamic acid, a polyester, and a polyimide, that have a benzene ring, a naphthalene ring, or an anthracene ring. When the polymer compound is used, the additive amount thereof is, for example, 0.1 to 50 parts by mass, relative to 100 parts by mass of the polymerizable compound (A).

The resist underlayer film forming composition of the present invention is preferably used in a solution state in which each component (hereinafter, called "solid content") such as the polymerizable compound (A) and the polymerization initiator (B) is dissolved in the solvent (C). The solid content is a component remaining after subtracting the solvent from all components of the resist underlayer film forming composition. The solvent can be used so long as the solvent can dissolve the solid content to prepare a homogeneous solution. When an organic silicon compound is hydrolyzed to obtain a condensation product from the resultant hydrolyzed product and the resultant condensation product is used as the polymerizable compound (A), an organic solvent used for hydrolysis of the organic silicon compound as it is preferably used as the solvent (C) of the resist underlayer film forming composition.

Examples of the solvent (C) include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N-dimethylformamide, N-dimethylacetamide, dimethyl sulfoxide, and N-methylpyrrolidone.

These solvents (C) may be used individually or in combination of two or more types thereof. As the solvent, a solvent having a boiling point of 80 to 250° C., or 100 to 200° C., or 120 to 180° C. is preferably used. When the boiling point of the solvent is low, the solvent is evaporated in a large amount during the application of the resist underlayer film forming composition to cause an increase of the viscosity of the composition, so that lowering of the applicability of the composition may be caused. When the boiling point of the solvent is high, it is considered that drying of the resist underlayer film forming composition after the application thereof takes much time. The solvent can be used in an amount by which the concentration of the solid content of the resist underlayer film forming composition becomes, for example, 0.5 to 50% by mass, or 3 to 40% by mass, or 10 to 30% by mass.

The present invention includes a process of applying the resist underlayer film forming composition on a substrate to be processed to form a coating film and a process of performing light-irradiation, heat-baking, or both of them relative to the coating film to form an underlayer film, to produce a semiconductor, a light-emitting diode, a solid-state image pickup device, a recording apparatus, or a display apparatus.

The present invention includes a process of applying the resist underlayer film forming composition of the present invention on a substrate to be processed to form a resist underlayer film, a process of performing heat-baking or light-irradiation relative to the resist underlayer film to cure the resist underlayer film, and a process of applying a resist composition for nanoimprint on the resist underlayer film and heat-baking the composition to form a resist for nanoimprint, so that can form a laminated structure used for a pattern forming process using nanoimprint.

Then, the present invention includes a process of applying a resist underlayer film forming composition on a substrate to form a resist underlayer film, a process of performing heat-baking, light-irradiation, or both of them relative to the resist underlayer film to cure the resist underlayer film, a process of applying a resist composition for nanoimprint on the resist underlayer film and heat-baking the resist composition to form a resist for nanoimprint, and a process of performing imprint by a step and repeat method, so that can form a laminated structure used for a pattern forming process using nanoimprint.

Then, the present invention further includes a process of imprinting the substrate for a semiconductor, a light-emitting diode, a solid-state image pickup device, a recording apparatus, or a display that is coated with the resist underlayer film and the resist, a process of parting a template (mold) from the resist after imprinting to obtain a resist pattern without development, a process of etching the underlayer film according to the resist pattern, and a process of processing the substrate according to the patterned photoresist and the patterned underlayer film to produce a semiconductor, a light-emitting diode, a solid-state image pickup device, a recording apparatus, or a display apparatus. For the imprinting, a photo-imprinting method or a thermo-imprinting method can be used.

The substrate to be processed is a substrate which has a hole having an aspect ratio represented by height/diameter of 1 or more and is used for a semiconductor, a light-emitting diode, a solid-state image pickup device, a recording apparatus, or a display apparatus.

Hereinafter, the use of the underlayer film forming composition of the present invention is described.

On a substrate to be processed (such as a silicon/silicon dioxide-coated substrate, a silicon wafer substrate, a silicon nitride substrate, a glass substrate, an ITO substrate, a polyimide substrate, and a low dielectric constant material (low-k material)-coated substrate) that is used for the production of a semiconductor, a light-emitting diode, a solid-state image pickup device, a recording apparatus, or a display apparatus, the resist underlayer film forming composition of the present invention is applied by an appropriate coating method such as spinner, coater, spray, and inkjet to form a coating film. Then, before performing light-irradiation or heat-baking relative to the coating film, if necessary, a drying process can be established. When a resist underlayer film forming composition containing a solvent is used, the drying process is preferably established.

The drying process is not particularly limited so long as the drying process is not by a method of heating at a high temperature. This is because, it is considered that when the resist underlayer film forming composition is heated at a high temperature (for example, a temperature of 300° C. or more), the sublimation or the like of the solid content contained in the resist underlayer film is caused, so that an apparatus is contaminated. The drying process can be performed, for example, by heating the substrate on a hot plate at 50 to 100° C. for 0.1 to 10 minutes. The drying process can also be performed, for example, by air-drying the substrate at room temperature (around 20° C.).

Next, relative to the resist underlayer film, heat-baking, light-irradiation, or both of them is(are) performed. The method for the light-irradiation is not particularly limited to be used so long as the method is a method capable of acting on the polymerization initiator (B) to effect polymerization of the polymerizable compound (A). The light-irradiation can be performed, for example, by using an ultra high pressure mercury lamp, a flash UV lamp, a high pressure mercury lamp, a low pressure mercury lamp, a DEEP-UV (deep ultraviolet) lamp, a xenon short arc lamp, a short arc metal halide lamp, a lamp for YAG laser exciting, a xenon flash lamp, and the like. The light-irradiation can be performed, for example, by using an ultra high pressure mercury lamp and by irradiating with lights having all wavelengths of around 250 nm to around 650 nm containing bright line spectra having peaks at wavelengths of 289 nm, 297 nm, 303 nm, 313 nm (j ray), 334 nm, and 365 nm (i ray) in an ultraviolet region and wavelengths of 405 nm (h ray), 436 nm (g ray), 546 nm, and 579 nm in a visible light region.

By light-irradiation, a cation species or an active radical is generated from the photopolymerization initiator in the resist underlayer film, and then, by these species and radical, the polymerization reaction of the polymerizable compound in the resist underlayer film is effected. Then, as a result of the polymerization reaction, the resist underlayer film is formed.

The thus formed resist underlayer film comes to have a low solubility in a solvent used for a resist composition for nanoimprint applied as an upper layer of the resist underlayer film, such as ethylene glycol monomethyl ether, ethylcellosolve acetate, diethylene glycol monoethyl ether, propylene glycol, propylene glycol monomethyl ether, propylene glycol monomethyl ether acetate, propylene glycol propyl ether acetate, toluene, methyl ethyl ketone, cyclohexanone, ethyl 2-hydroxypropionate, ethyl 2-hydroxy-2-methylpropionate, ethyl ethoxyacetate, methyl pyruvate, ethyl lactate, and butyl lactate. Therefore, the resist underlayer film formed from the resist underlayer film forming composition of the present invention becomes a resist underlayer film causing no intermixing with the overcoated resist for nanoimprint.

The conditions for heat-baking (heating) are accordingly selected from the baking temperatures of 80° C. to 300° C. and the baking times of 0.3 to 90 minutes. Preferably, the conditions are the baking temperature of 130° C. to 300° C. and the baking time of 0.5 to 5 minutes.

The resist underlayer film forming composition of the present invention can be applied to a substrate having an aspect ratio represented by height/diameter of 0.01 or more, for example, having a hole of a diameter of 60 to 100,000 nm, or having an aspect ratio represented by height/width of 0.01 or more, for example, having a step of a width of 60 to 100,000 nm.

Then, the resist underlayer film forming composition of the present invention can be used for filling such a hole with the underlayer film without causing a gap (void). In addition, the underlayer film forming composition of the present invention can be applied to a substrate to be processed having holes of an aspect ratio of 0.01 or more coarsely or finely (substrate having a portion in which holes exist coarsely and a portion in which holes exist finely). Then, the resist underlayer film forming composition of the present invention can be used for forming a planar resist underlayer film on the surface of such a substrate in which holes exist coarsely or finely.

The resist underlayer film forming composition of the present invention can also be applied to a substrate to be processed which has a hole or step having an aspect ratio of less than 0.01 and is used for the production of a semiconductor, a light-emitting diode, a solid-state image pickup device, a recording apparatus, or a display apparatus. In addition, the resist underlayer film forming composition of the present invention can also be applied to a substrate having no step or the like.

The film thickness of the resist underlayer film formed from the resist underlayer film forming composition of the present invention is on the surface of the substrate, for example, 1 to 10,000 nm, or 5 to 10,000 nm, or 5 to 1,000 nm.

Next, on the resist underlayer film, a resist is formed. Herewith, on the substrate to be processed used for the production of a semiconductor, a light-emitting diode, a solid-state image pickup device, a recording apparatus, or a display apparatus, a laminated structure of the resist underlayer film and the resist is formed. The formation of the resist can be performed by an appropriate known method such as spinner, coater, spray, and inkjet, that is, by applying a solution of a resist composition on the resist underlayer film and by performing light-irradiation or heat-baking relative to the resultant coating. The resist formed on the resist underlayer film of the present invention is not particularly limited, and as the resist, any one of an acrylate-type organic acrylic resist and an inorganic resist that are used for general purposes can be used. There is disclosed, for example, a photocurable inorganic resist containing, as the main component, a siloxane polymer (see Non-patent Document 2), which is publicly-known. Further, there is disclosed an organic resist using polyvinyl alcohol (see Non-patent Document 3). There is disclosed a resist material composition containing a fluorine additive used in photo nanoimprint lithography. There is disclosed an example using a photocurable resin and forming a pattern by photo nanoimprint lithography (Patent Document 8). There is disclosed a resist curable composition for nanoimprint lithography containing a polymerizable compound, a photopolymerization initiator, and an interface active polymerization initiator and having a limited viscosity (Patent Document 9).

The pattern forming process by imprint is divided into a bulk transferring method and a step and repeat method. The bulk transferring method is a method including: forming a resist film on the whole surface of the substrate to be processed; and then using a template having the same size as that of the substrate, pressing the template against the substrate to transfer a pattern. On the other hand, the step and repeat method is a method including: using a template processed into a smaller chip size, performing repeatedly the transferring per a size of the template as with the exposure treatment by photolithography; and performing finally the pattern formation on the whole surface of the substrate by imprint. Generally, the substrate or the template has warp or unevenness, so that when the substrate to be processed is large or when the formation of a fine pattern is necessary, it becomes difficult to press the template homogeneously and parallel against the substrate to be processed. From described above, the step and repeat method is more preferred.

A pattern forming process by photo-imprint is excellent in releasing properties between the template (mold) and the resist, in alignment precision, and in productivity, causes a small amount of defect and a small amount of the change in the pattern size by thermal expansion or thermal contraction of the resist, and takes a short processing time in comparison with a pattern forming process by thermo-imprint. In terms of the above described superiority of the pattern forming process by photo-imprint, the pattern forming process by photo-imprint is suitable for an application requiring a finer processing.

The pattern formation is performed by imprint through an arbitrary template. In the pattern forming process by imprint, the pattern formation by imprint is performed by: applying the underlayer film composition of the present invention used as an underlayer of the resist for nanoimprint on a substrate to be processed; applying a resist composition for imprint on the underlayer film as an upper layer thereof; and pressing a light transmittable template against the resist composition and performing heat-baking, light-irradiation, or both of them. In the pattern forming process by photo-imprint, at least one of the template and the substrate uses a material transmitting an irradiated light.

The template has a same-sized pattern to be imprinted. Although the template can form a pattern according to the desired processing precision, for example, by photolithography, an electron beam drawing method, or the like, in the present invention, the template pattern forming method is not particularly limited. Although the template applicable to the present invention is not particularly limited, the template may be a template having a predetermined strength and durability. Specific examples of the template include a glass, a quartz, an acrylic resin, a light-transparent resin such as a polycarbonate resin, a transparent metal evaporated film, a flexible film such as polydimethylsiloxane, a photo-cured film, and a metal film. Particularly, in terms of transparency and quality, a patterned quartz is preferred.

The non-light transmitting-type template (mold) material is not particularly limited so long as it is a material having a predetermined strength and shape retentivity. Specific examples of such a material include a ceramic material, an evaporated film, a magnetic film, a reflecting film, a metal substrate such as Ni, Cu, Cr, and Fe, and a substrate such as SiC, silicone, nitride silicone, polysilicone, oxide silicone, and amorphous silicone, to which the examples are not particularly limited. The shape may be any one of a plate-shape mold and a roll-shape mold. The roll-shape mold is applied particularly when continuous productivity of transferring is necessary.

With respect to the pattern formation by imprint, the releasing property between the mold and a cured product of the resist for photo nanoimprint lithography is important, so that there is performed an attempt to solve an adhesion problem by using a mold or surface treatment of a mold, specifically, by using a hydrogenated silsesqui oxane or a fluorinated ethylene propylene copolymer mold.

As the template used in the present invention, it is preferred to use a template that has been subjected to releasing treatment by a silane coupling agent such as a silicone-based or fluorine-based silane coupling agent for enhancing the releasing property between a cured product of a resist for photo nanoimprint lithography and the template. For example, a commercially available mold release agent such as tridecafluoro 1,1,2,2-tetrahydrooctyldimethylsilane and Novec EGC-1720 can also be preferably used, to which the examples are not particularly limited.

Then, using a resist pattern formed by imprint as a protecting film, the removal of the resist underlayer film of the present invention and the processing of a semiconductor substrate are performed. The removal of the resist underlayer film can be performed by dry etching using a gas such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, and chlorine trifluoride. By the removal of the resist underlayer film, a pattern containing the resist underlayer film and the resist is formed on the substrate to be processed.

The first method using the resist underlayer film formed from the resist underlayer film forming composition of the present invention as a hardmask includes a process of applying the resist underlayer film forming composition of the present invention on a semiconductor substrate and performing heat-baking, light-irradiation, or both of them to form a resist underlayer film, a process of applying a resist composition on the resist underlayer film to form a resist film, a process of imprinting the resist film, a process of parting the template from the resist after imprinting to obtain a resist pattern, a process of etching the resist underlayer film according to the resist pattern, and a process of processing the semiconductor substrate according to the patterned resist and underlayer film, to produce a semiconductor, a light-emitting diode, a solid-state image pickup device, a recording apparatus, or a display apparatus. Here, the resist underlayer film has a large etching rate same as that of the resist or more under a $CF_4$ gas condition used during etching of the resist, so that the resist underlayer film of the present invention can be removed by etching according to the resist pattern, and using the resist and the resist underlayer film as protecting films, the semiconductor substrate can be processed.

The second method using the resist underlayer film formed from the resist underlayer film forming composition of the present invention as a hardmask includes a process of forming an organic film (a gap filling material or a spin-on carbon material) on a substrate to be processed by an applying-type organic film forming composition, a process of applying the resist underlayer film forming composition of the present invention on the organic film and performing heat-baking, light-irradiation, or both of them to form a resist underlayer film, a process of applying a resist composition on the resist underlayer film to form a resist film, a process of imprinting the resist film, a process of parting the template from the resist after imprinting to obtain a resist pattern, a process of etching the resist underlayer film according to the resist pattern, and a process of processing the semiconductor substrate according to the patterned resist and underlayer film, to produce a semiconductor, a light-emitting diode, a solid-state image pickup device, a recording apparatus, or a display apparatus. Here, the resist underlayer film has a large etching rate same as that of the resist or more under a $CF_4$ gas condition used during etching of the resist, so that the underlayer film of the present invention can be removed by etchingaccording to the resist pattern and the resist pattern can be transferred to the resist underlayer film of the present invention. Further, the resist underlayer film has a far smaller etching rate than that of the organic film (having the same etching characteristic as that of the resist) under an $O_2$ (oxygen) gas condition used during etching of the organic film that is formed under the present invention. Thus the resist pattern transferred to the resist underlayer film of the present invention can further be transferred to the organic film, and using the organic film as a protecting film, the substrate to be processed can be processed.

On a substrate to be processed having unevenness or warp, the resist underlayer film forming composition of the present invention can be formed for the purpose of planarization of the substrate.

Hereinafter, the present invention will be more specifically described referring to Examples, which should not be construed as limiting the scope of the present invention.

EXAMPLES

Example 1

45.0 g of 3-glycidoxypropyltrimethoxysilane (manufactured by Shin-Etsu Chemical Co., Ltd.; trade name: KBM 403), 26.0 g of monomethyltrimethoxysilane (manufactured by Shin-Etsu Chemical Co., Ltd.; trade name: KBM 13), 20.2 g of water, and 0.690 g of p-toluenesulfonic acid were added to 143.2 g of propylene glycol monomethyl ether and the resultant mixture was stirred at 80° C. for 24 hours to hydrolyze 3-glycidoxypropyltrimethoxysilane and monomethyltrimethoxysilane and to obtain a condensation product thereof. The molar ratio of 3-glycidoxypropyltrimethoxysilane and monomethyltrimethoxysilane was 50%:50%. The obtained polysiloxane resin had a weight average molecular weight of 1,300 and a number average molecular weight of 1,000.

Next, to 20.0 g of the reaction solution, 0.0400 g of a photopolymerization initiator triphenylsulfoniumtris(trifluoromethylsulfonyl) methanide (Ciba Japan K. K.; trade name: CGI TPS C1) and 0.0467 g of a surfactant (manufactured by Dainippon Ink & Chemicals, Inc.; trade name: MEGAFAC R30) were added and the resultant mixture was mixed with 45.5 g of propylene glycol monomethyl ether and 14.5 g of propylene glycol monomethyl ether acetate to prepare a 10% by mass solution. Then, the solution was filtered using a polyethylene microfilter having a pore diameter of 0.2 µm to prepare a solution of a resist underlayer film forming composition.

Example 2

38.1 g of 3-glycidoxypropyltrimethoxysilane (manufactured by Shin-Etsu Chemical Co., Ltd.; trade name: KBM 403), 11.0 g of monomethyltrimethoxysilane (manufactured by Shin-Etsu Chemical Co., Ltd.; trade name: KBM 13), 20.0 g of 3-methacryloxypropyltrimethoxysilane (manufactured by Shin-Etsu Chemical Co., Ltd.; trade name: KBM 503), 17.1 g of water, and 0.583 g of p-toluenesulfonic acid were added to 139.2 g of propylene glycol monomethyl ether and the resultant mixture was stirred at 80° C. for 8 hours to hydrolyze 3-glycidoxypropyltrimethoxysilane, monomethyltrimethoxysilane, and 3-methacryloxypropyltrimethoxysilane and to obtain a condensation product thereof. The molar ratio of 3-glycidoxypropyltrimethoxysilane, monomethyltrimethoxysilane, and 3-methacryloxypropyltrimethoxysilane was 50%:25%:25%. The obtained polysiloxane resin had a weight average molecular weight of 900 and a number average molecular weight of 800.

Next, to 10.0 g of the reaction solution, 0.0200 g of a photopolymerization initiator triphenylsulfoniumtris(trifluoromethylsulfonyl) methanide (Ciba Japan K. K.; trade name: CGI TPS C1) and 0.0233 g of a surfactant (manufactured by Dainippon Ink & Chemicals, Inc.; trade name: MEGAFAC R30) were added and the resultant mixture was mixed with 22.7 g of propylene glycol monomethyl ether and 7.24 g of propylene glycol monomethyl ether acetate to prepare a 10% by mass solution. Then, the solution was filtered using a polyethylene microfilter having a pore diameter of 0.2 μm to prepare a solution of an underlayer film forming composition.

Example 3

38.1 g of 3-glycidoxypropyltrimethoxysilane (manufactured by Shin-Etsu Chemical Co., Ltd.; trade name: KBM 403), 40.0 g of 3-methacryloxypropyltrimethoxysilane (manufactured by Shin-Etsu Chemical Co., Ltd.; trade name: KBM 503), 17.1 g of water, and 0.583 g of p-toluenesulfonic acid were added to 157.3 g of propylene glycol monomethyl ether and the resultant mixture was stirred at 80° C. for 8 hours to hydrolyze 3-glycidoxypropyltrimethoxysilane and 3-methacryloxypropyltrimethoxysilane and to obtain a condensation product thereof. The molar ratio of 3-glycidoxypropyltrimethoxysilane and 3-methacryloxypropyltrimethoxysilane was 50%:50%. The obtained polysiloxane resin had a weight average molecular weight of 1,200 and a number average molecular weight of 1,000.

Next, to 10.0 g of the reaction solution, 0.0200 g of a photopolymerization initiator triphenylsulfoniumtris(trifluoromethylsulfonyl) methanide (Ciba Japan K. K.; trade name: CGI TPS C1) and 0.0233 g of a surfactant (manufactured by Dainippon Ink & Chemicals, Inc.; trade name: MEGAFAC R30) were added and the resultant mixture was mixed with 22.7 g of propylene glycol monomethyl ether and 7.24 g of propylene glycol monomethyl ether acetate to prepare a 10% by mass solution. Then, the solution was filtered using a polyethylene microfilter having a pore diameter of 0.2 μm to prepare a solution of an underlayer film forming composition.

(Dissolution Test in Resist Solvent)

Each of the solutions of the resist underlayer film forming compositions obtained in Example 1 to Example 3 was applied on a semiconductor substrate (silicon wafer substrate) by a spinner to form a coating film. The coating film was irradiated with all wavelengths from a lamp enhanced at 380 nm (manufactured by Orc Manufacturing Co., Ltd.; metal halide lamp) (exposure dose: 200 mJ/cm$^2$). Then, for removing the solvent and drying the coating film, the coating film was heated on a hot plate at 130° C. for 1 minute to form a resist underlayer film (film thickness: 179 nm). Next, the resist underlayer film was immersed in ethyl lactate and propylene glycol monomethyl ether both of which are solvents used for a resist for imprint, and butyl acrylate contained in the resist for imprint used in the present invention. It was confirmed that the resist underlayer films obtained from the resist underlayer film forming compositions obtained in Example 1 to Example 3 were insoluble in these solvents.

(Measurement of Optical Parameters)

In the same manner as described above, the resist underlayer film was formed on a silicon wafer substrate from each of the solutions of the resist underlayer film forming compositions obtained in Example 1 to Example 3 in a film thickness described in Table 1. Then, using a spectro-ellipsometer, the refractive index (n value) and the attenuation coefficient (k value) at a wavelength of 633 nm of the underlayer film were measured and these measured values are shown in Table 1.

In Table 1, the results of the description "Examples 1 to 3" mean the result of the evaluation of the resist underlayer films obtained from the resist underlayer film forming compositions of Examples 1 to 3.

TABLE 1

| | Film thickness (nm) | Refractive index (n value) | Attenuation coefficient (k value) |
|---|---|---|---|
| Example 1 | 179 | 1.50 | 0.0003 |
| Example 2 | 185 | 1.49 | 0.0002 |
| Example 3 | 171 | 1.50 | 0.0004 |

(Test of Dry Etching Rate)

In the same manner as described above, the resist underlayer film was formed on a silicon wafer substrate from each of the solutions of the resist underlayer film forming compositions obtained in Example 1 to Example 3 in a film thickness described in Table 2. Then, using an RIE system ES401 (manufactured by Nippon Scientific Co., Ltd.) and under a condition of using $O_2$ and $CF_4$ as a dry etching gas, the dry etching rate (loss amount of film thickness per unit time) of the underlayer film was measured. The obtained result is shown as selectivity of the dry etching rate. The ratio of the dry etching rate of the underlayer film when the dry etching rate of a photoresist for KrF laser lithography (manufactured by Shin-Etsu Chemical Co., Ltd.; trade name: SEPR 430) under the same conditions is assumed to be 1.00, is the selection ratio of the dry etching rate.

In Table 2, the results of the description "Examples 1 to 3" mean the result of the evaluation of the resist underlayer films obtained from the resist underlayer film forming compositions of Examples 1 to 3.

TABLE 2

| | Film thickness (nm) | $O_2$ gas selection ratio | $CF_4$ gas selection ratio |
|---|---|---|---|
| Example 1 | 179 | 0 | 1.5 |
| Example 2 | 185 | 0 | 1.5 |
| Example 3 | 171 | 0 | 1.5 |

(Preparation of Photocurable Resist for Imprint)

11.7 g of butyl acrylate (manufactured by Tokyo Chemical Industry Co., Ltd.), 20.0 g of isobornyl acrylate (manufactured by Tokyo Chemical Industry Co., Ltd.), 9.52 g of ethylene glycol dimethacrylate (manufactured by Tokyo Chemical Industry Co., Ltd.), and 0.788 g of 2-hydroxy-2-methyl-1-phenyl-propane-1-one (manufactured by Ciba Japan K. K.; trade name: DAROCUR 1173) were mixed and the resultant mixture was stirred at room temperature for 5 hours. The molar ratio of butyl acrylate, isobornyl acrylate, ethylene glycol dimethacrylate, and 2-hydroxy-2-methyl-1-phenyl-propane-1-one was 38%:40%:20%:2%.

(Photonanoimprint Test)

In the nanoimprint test of the resist underlayer film of the present invention, a step and repeat method by a photo-nanoimprint apparatus (manufactured by Molecular Imprints, Inc.; trade name: IMPRIO) was used. From each of the solutions of the resist underlayer film forming compositions obtained in Examples 1 to 3, a resist underlayer film (film thickness: 50 nm) was formed on a silicon wafer substrate. Liquid drops of the photocurable resist for imprint in an amount of 0.00784 µL per one position were applied on the resist underlayer film at a total of 49 positions (7×7) in an area of 2.5×2.5 cm² by a drop applying method. The substrate to be processed on which liquid drops of the resist material were applied was placed parallel to a quartz template in which 80 nm lines were carved with the same interval so that the distance between the substrate and the template was homogeneous. At a rate of from 0.4 mm/sec to 0.003 mm/sec, the distance was reduced to lower the position of the template toward the substrate to be processed. After the template started to be contacted with the resist surface, a load was applied to the template with a pressing pressure of 1.0 to 1.5 N to adhere completely a convexo-concave portion of the template to the substrate. Then, the substrate with the template was subjected to light-irradiation (for 20 seconds) to photo-cure the resist for imprint. The position of the template was elevated to complete the forming process of the resist pattern by photonanoimprint.

The imprinting by forming a resist film in the same manner as described above directly on a silicon substrate without using a resist underlayer film forming composition was performed as Comparative Example 1.

In Table 3, the results of the description "Examples 1 to 3" mean the results of evaluating the photoimprint using the resist underlayer films obtained from the resist underlayer film forming compositions of Examples 1 to 3. Comparative Example 1 is a result of evaluating the photoimprint without using the resist underlayer film forming composition.

The result of the nanoimprint evaluation (80 nm line, the ratio of line:space was 1:1) is shown in Table 3.

The evaluation result 1 indicates rectangularity of the resist pattern. In the evaluation of the cross sectional shape of the resist by an SEM observation, (advantageous) indicates a result in which an angle formed by a resist side wall and the surface of the resist underlayer film was 80 to 100°, and (failure) indicates a result in which the above angle was less than 80° or 101° or more.

The evaluation result 2 indicates curing properties of the resist that was confirmed by the above-described dissolution test in a resist solvent. (advantageous) indicates a result in which when the substrate was immersed in ethyl lactate and propylene glycol monoethyl ether, the difference in the film thickness of the resist between before and after the immersion was 1 nm or less. (failure) indicates a result in which the difference in the film thickness of the resist between before and after the immersion was 1 nm or more and the resist pattern shape disappeared in the solvent after the immersion.

The evaluation result 3 indicates fluidity (film-remaining property) of the resist on the resist underlayer film. In the cross sectional shape evaluation of the resist by the SEM observation, (advantageous) indicates a result in which the resist spread homogeneously into the size of the template, and further, film-remaining of the resist was homogeneous. (pass) indicates a result in which although film-remaining of the resist had unevenness, the resist spread homogeneously into the size of the template. (failure) indicates a result in which the resist did not spread homogeneously into the size of the template.

The evaluation 4 indicates peeling properties of the resist from the template. (advantageous) indicates a result in which the resist did not adhere to the template and the pattern forming succeeded, and (failure) indicates a result in which a part of the resist adhered to the template and the pattern on the substrate was peeled.

TABLE 3

| | Evaluation result 1 | Evaluation result 2 | Evaluation result 3 | Evaluation result 4 |
|---|---|---|---|---|
| Example 1 | Advantageous | Advantageous | Pass | Advantageous |
| Example 2 | Advantageous | Advantageous | Advantageous | Advantageous |
| Example 3 | Advantageous | Advantageous | Advantageous | Advantageous |
| Comparative Example 1 | Advantageous | Advantageous | Pass | Failure |

On the resist underlayer films obtained from the compositions for forming the resist underlayer film for nanoimprint of Examples 1 to 3, the resist did not adhere to the template and a pattern of 80 nm line (ratio of line:space was 1:1) could be homogeneously produced in an area of 2.5×2.5 cm².

Particularly, when the resist underlayer films obtained from the compositions for forming the resist underlayer film for nanoimprint of Examples 2 and 3 were used, the resist liquid drop could more easily spread before the light-irradiation by the imprint process and the resist underlayer films were excellent in resist fluidity (film-remaining property). On the other hand, after the light-irradiation, the interaction of the resist underlayer film with the resist was improved, so that it is considered that the mold-releasing property of the resist from the template became the best.

This is because, when the resist underlayer film obtained from the composition for forming the resist underlayer film for nanoimprint of Example 2 was used, the composition for forming the resist underlayer film for nanoimprint of Example 2 is a composition for forming the resist underlayer film for nanoimprint by which the contact angle with water that was 67° before the light-irradiation after the film-formation of the resist underlayer film was reduced to 63° after the light-irradiation (with a lamp enhanced at 380 nm (manufactured by Orc Manufacturing Co., Ltd.; metal halide lamp), exposure dose: 2 J/cm²).

In addition, when the resist underlayer film obtained from the composition for forming the resist underlayer film for nanoimprint of Example 3 was used, the composition for forming the resist underlayer film for nanoimprint of Example 3 is a composition for forming the resist underlayer film for nanoimprint by which the contact angle measured by a contact angle meter (DM; manufactured by Kyowa Interface Science Co., Ltd.) with water that was 71° before the light-irradiation after the film-formation of the resist underlayer film was reduced to 58° after the light-irradiation (with a lamp enhanced at 380 nm (manufactured by Orc Manufacturing Co., Ltd.; metal halide lamp), exposure dose: 2 J/cm$^2$).

As reference data, with the composition for forming the resist underlayer film for nanoimprint of Example 1, the contact angle with water that was 67° before the light-irradiation was maintained at 67° after the light-irradiation (with a lamp enhanced at 380 nm (manufactured by Orc Manufacturing Co., Ltd.; metal halide lamp), exposure dose: 2 J/cm$^2$). It is therefore considered that there appeared a difference between the evaluation result 3 and the evaluation result 4.

On the other hand, when the resist was, as Comparative Example 1, applied directly on a silicon wafer substrate without using the composition for forming the resist underlayer film for nanoimprint and imprinted, a pattern of 80 nm line (ratio of line:space was 1:1) was partly adhered to the template and could not be homogeneously produced on an area of 2.5×2.5 cm$^2$.

The invention claimed is:

1. A composition for forming a resist underlayer film used in a pattern forming process using nanoimprint by performing heat-baking, light-irradiation, or a combination thereof, the composition comprising:
    a silicon atom-containing polymerizable compound (A);
    a polymerization initiator (B); and
    a solvent (C);
    wherein:
        the silicon atom-containing polymerizable compound (A) is a compound comprising both a thermal cation polymerizable reactive group and a photo radical polymerizable reactive group;
        the thermal cation polymerizable reactive group and the photo radical polymerizable reactive group are present in the silicon atom-containing polymerizable compound (A) in a molar ratio of 10:90 to 90:10;
        the polymerizable compound (A) is produced by:
            hydrolyzing 3-glycidoxypropyltrimethoxysilane, monomethyltrimethoxysilane, and 3-methacryloxypropyltrimethoxysilane, and condensing the resultant hydrolyzed products; or
            hydrolyzing 3-glycidoxypropyltrimethoxysilane and 3-methacryloxypropyltrimethoxysilane, and condensing the resultant hydrolyzed products; and
        a molar ratio of 3-glycidoxypropyltrimethoxysilane to 3-methacryloxypropyltrimethyoxysilane is in a range of from 1:1 to 2:1; and
        the polymerizable compound (A) has a weight average molecular weight in a range of from 900 to 1,300.

2. The composition for forming the resist underlayer film according to claim 1, wherein the polymerizable compound (A) contains silicon atoms in a content of 5 to 45% by mass.

3. The composition for forming the resist underlayer film according to claim 1, wherein the polymerization initiator (B) is a photopolymerization initiator.

4. The composition for forming the resist underlayer film according to claim 1, wherein the polymerization initiator (B) is a thermopolymerization initiator.

5. The composition for forming the resist underlayer film according to claim 1, further containing a crosslinkable compound, a surface modifier, or a combination thereof.

6. The composition for forming the resist underlayer film according to claim 1, wherein the solvent (C) is at least one selected from the group consisting of an aliphatic hydrocarbon solvent, aromatic hydrocarbon solvent, alcohol solvent, ketone solvent, amide solvent, ester solvent, ether solvent, nitrogen-containing solvent, and aprotic solvent.

7. The composition for forming the resist underlayer film according to claim 1, wherein the solvent (C) is at least one selected from the group consisting of propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate.

8. A method of forming a laminated structure used in a pattern forming process using nanoimprint, the method comprising:
    applying the composition for forming the resist underlayer film as claimed in claim 1 on a substrate to form a resist underlayer film;
    performing heat-baking, light-irradiation, or a combination thereof to the resist underlayer film to cure the resist underlayer film; and
    applying a resist composition for nanoimprint on the resist underlayer film and heat-baking the applied resist composition to form a resist for nanoimprint.

9. The method according to claim 8, wherein the substrate has:
    a hole having an aspect ratio represented by height/diameter of 0.01 or more, or
    a step having an aspect ratio represented by height/width of 0.01 or more.

10. The forming method according to claim 8, wherein the light-irradiation is performed by a light having a wavelength of 250 nm to 650 nm.

11. A method of forming a laminated structure used in a pattern forming process using nanoimprint, the method comprising:
    applying the composition for forming the resist underlayer film as claimed in claim 1 on a substrate to form a resist underlayer film;
    performing heat-baking, light-irradiation, or a combination thereof to the resist underlayer film to cure the resist underlayer film;
    applying a resist composition for nanoimprint on the resist underlayer film and heat-baking the applied resist composition to form a resist for nanoimprint; and
    imprinting by a step and repeat method.

* * * * *